(12) United States Patent
Shimada et al.

(10) Patent No.: US 9,997,565 B2
(45) Date of Patent: Jun. 12, 2018

(54) MAGNETIC MEMORY ELEMENT AND MAGNETIC MEMORY

(71) Applicant: Toshiba Memory Corporation, Tokyo (JP)

(72) Inventors: Takuya Shimada, Kanagawa (JP);
Hirofumi Morise, Kanagawa (JP);
Shiho Nakamura, Kanagawa (JP);
Tsuyoshi Kondo, Kanagawa (JP);
Yasuaki Ootera, Kanagawa (JP);
Michael Arnaud Quinsat, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/491,078

(22) Filed: Apr. 19, 2017

(65) Prior Publication Data

US 2017/0221964 A1    Aug. 3, 2017

Related U.S. Application Data

(62) Division of application No. 14/921,472, filed on Oct. 23, 2015, now Pat. No. 9,659,996.

(30) Foreign Application Priority Data

Dec. 2, 2014   (JP) .................. 2014-243931

(51) Int. Cl.
*H01L 29/66* (2006.01)
*H01L 27/22* (2006.01)
(Continued)

(52) U.S. Cl.
CPC .......... *H01L 27/228* (2013.01); *G11C 11/161* (2013.01); *G11C 11/1659* (2013.01);
(Continued)

(58) Field of Classification Search
CPC .......... H01L 43/00; H01L 43/02; H01L 43/04; H01L 43/065; H01L 43/08; H01L 43/10;
(Continued)

(56) References Cited

U.S. PATENT DOCUMENTS 6,834,005 B1   12/2004 Parkin
2006/0227466 A1   10/2006 Yagami
(Continued)

FOREIGN PATENT DOCUMENTS

JP   2005-353819   12/2005
JP   2007-073103   3/2007
(Continued)

OTHER PUBLICATIONS

Komine et al., "Current-induced domain wall motion in a multilayered nanowire for achieving high density bit", Journal of Applied Physics, 111, 07D314-1 to 07D314-3 (2012).
(Continued)

*Primary Examiner* — Syed Gheyas
(74) *Attorney, Agent, or Firm* — Finnegan, Henderson, Farabow, Garrett & Dunner, L.L.P.

(57) ABSTRACT

According to one embodiment, a magnetic memory element comprises a first magnetic unit, a second magnetic unit, a first insulating unit, a first electrode, a second electrode, and a third electrode. The first magnetic unit includes a plurality of magnetic domains. The second magnetic unit includes a first region and a second region. The first region includes a conductive material. The second region includes an insulating material. At least one of the first region or the second region is magnetic. The first insulating unit is provided between the first magnetic unit and the second magnetic unit. The first electrode and the second electrode are connected to the first magnetic unit. A part of the second magnetic unit and a part of the first insulating unit are
(Continued)

provided between the third electrode and a part of the first magnetic unit.

19 Claims, 21 Drawing Sheets

(51) Int. Cl.
    *H01L 43/08* (2006.01)
    *G11C 11/16* (2006.01)
    *G11C 19/08* (2006.01)
    *H01L 43/02* (2006.01)
    *H01L 43/10* (2006.01)
    *H01L 43/12* (2006.01)

(52) U.S. Cl.
    CPC ...... *G11C 11/1673* (2013.01); *G11C 11/1675* (2013.01); *G11C 11/1697* (2013.01); *G11C 19/0808* (2013.01); *G11C 19/0841* (2013.01); *H01L 43/02* (2013.01); *H01L 43/08* (2013.01); *H01L 43/10* (2013.01); *H01L 43/12* (2013.01)

(58) Field of Classification Search
    CPC ....... H01L 43/12; H01L 43/14; G11C 11/161; G11C 11/1697; G11C 11/1673
    See application file for complete search history.

(56) References Cited

U.S. PATENT DOCUMENTS

| | | |
|---|---|---|
| 2008/0137395 A1 | 6/2008 | Hwang |
| 2009/0224341 A1 | 9/2009 | Li |
| 2009/0251956 A1* | 10/2009 | Hwang ................. H01L 27/228 365/171 |
| 2010/0046288 A1* | 2/2010 | Honjou ................... H01L 43/08 365/171 |
| 2010/0270143 A1 | 10/2010 | Kikuchi |
| 2013/0077395 A1 | 3/2013 | Kondo et al. |
| 2013/0242647 A1 | 9/2013 | Nakamura et al. |
| 2015/0380638 A1 | 12/2015 | Ootera et al. |

FOREIGN PATENT DOCUMENTS

| | | |
|---|---|---|
| JP | 2009-043848 | 2/2009 |
| JP | 2011-181642 | 9/2011 |
| JP | 2013-73980 | 4/2013 |
| JP | 2013-197174 | 9/2013 |
| JP | 2014-130799 | 7/2014 |
| JP | 2016-9806 | 1/2016 |

OTHER PUBLICATIONS

U.S. Appl. No. 14/704,359, Ootera et al., "Magnetic Memory and Shift Register Memory", filed May 5, 2015.

\* cited by examiner

MAGNETIC MEMORY ELEMENT AND MAGNETIC MEMORY

This is a division of U.S. patent application Ser. No. 14/921,472, filed Oct. 23, 2015, which is incorporated herein by reference.

CROSS-REFERENCE TO RELATED APPLICATIONS

This application is based upon and claims the benefit of priority from Japanese Patent Application No. 2014-243931, filed on Dec. 2, 2014; the entire contents of which are incorporated herein by reference.

FIELD

Embodiments described herein relate generally to a magnetic memory element and a magnetic memory.

BACKGROUND

In recent years, a domain wall movement-type magnetic memory element that utilizes the movement of domain walls due to a current has been proposed as a method to increase memory capacity. In such a magnetic memory element, a magnetic unit that includes multiple magnetic domains is provided; and the movement of the domain walls is performed by causing a current to flow in the magnetic unit.

It is desirable to reduce the power consumption of the magnetic memory element.

DETAILED DESCRIPTION

Figure 1:
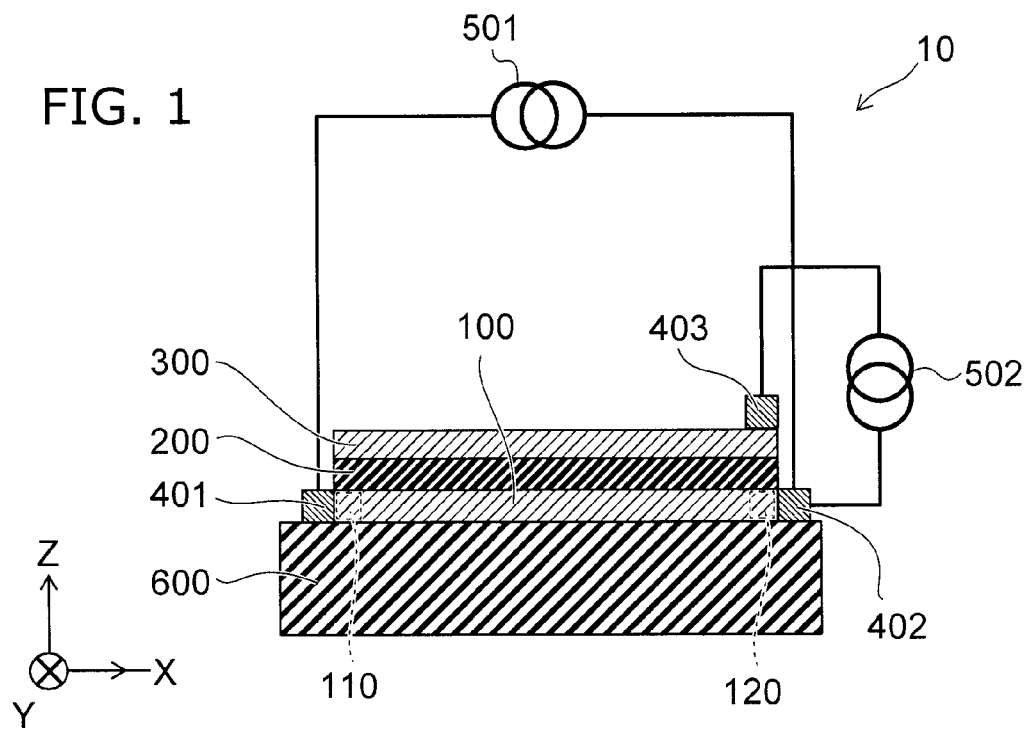
FIG. 1 is a schematic cross-sectional view showing the magnetic memory element 10 according to the first embodiment.

According to one embodiment, a magnetic memory element comprises a first magnetic unit, a second magnetic unit, a first insulating unit, a first electrode, a second electrode, and a third electrode. The first magnetic unit includes a plurality of magnetic domains. The plurality of magnetic domains is arranged in a direction in which the first magnetic unit extends. The second magnetic unit includes a first region and a second region. The first region includes a conductive material. The second region includes an insulating material. At least one of the first region or the second region is magnetic. The first insulating unit is provided between the first magnetic unit and the second magnetic unit. The first electrode is connected to the first magnetic unit. The second electrode is connected to a portion of the first magnetic unit different from a portion of the first magnetic unit connected to the first electrode. A part of the second magnetic unit and a part of the first insulating unit are provided between the third electrode and a part of the first magnetic unit.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In some of the drawings, the magnetization directions are illustrated by arrows inside components including magnetic materials.

First Embodiment

A magnetic memory element 10 according to a first embodiment will now be described using FIG. 1.

FIG. 1 is a schematic cross-sectional view showing the magnetic memory element 10 according to the first embodiment.

Configuration of Magnetic Memory Element

The magnetic memory element 10 includes a first magnetic unit 100, an insulating unit 200, a second magnetic unit 300 that includes a first region 301 and a second region 302, a first electrode 401, a second electrode 402, a third electrode 403, a current source 501, and a current source 502.

The first magnetic unit 100 is provided on a substrate 600 and extends in an X-direction. The first magnetic unit 100 includes multiple magnetic domains arranged in the X-direction.

The first magnetic unit 100 includes a first portion 110 to which the first electrode 401 is connected, and a second portion 120 to which the second electrode 402 is connected. The first portion 110 is separated from the second portion 120 in the X-direction. In other words, the second electrode 402 is connected to a portion of the first magnetic unit 100 that is different from the portion of the first magnetic unit 100 connected to the first electrode 401.

The insulating unit 200 is provided on at least a part of the first magnetic unit 100. The insulating unit 200 extends in the X-direction along the first magnetic unit 100. For example, the insulating unit 200 is provided in contact with the first magnetic unit 100.

The second magnetic unit 300 is provided on at least a part of the insulating unit 200. The insulating unit 200 is provided between the first magnetic unit 100 and the second magnetic unit 300. The second magnetic unit 300 extends in the X-direction along the insulating unit 200. For example, the second magnetic unit 300 is provided in contact with the insulating unit 200.

The magnetization direction of the first magnetic unit 100 changes more easily than the magnetization direction of the second magnetic unit 300. The magnetization direction of the second magnetic unit 300 changes less easily than the magnetization direction of the first magnetic unit 100 and functions as a so-called fixed magnetic layer.

The second magnetic unit 300 includes the first region 301 and the second region 302.

The first region 301 includes a conductive material such as a metal, etc. The second region 302 includes an insulating material.

Therefore, the electrical resistance of the second region 302 is higher than the electrical resistance of the first region 301.

Details of the first region 301 and the second region 302 are described below.

The third electrode 403 is connected to the second magnetic unit 300. The third electrode 403 is provided on a part of the second magnetic unit 300. In other words, a part of the second magnetic unit 300 is provided between the third electrode 403 and a part of the insulating unit 200.

The first electrode 401 and the second electrode 402 are connected to the first current source 501. The first current source 501 moves the domain walls (the magnetic domains) that are included in the first magnetic unit 100 by causing a current to flow between the first electrode 401 and the second electrode 402.

The second electrode 402 and the third electrode 403 are connected to the second current source 502. The second current source 502 performs reading and writing of magnetization information to and from the first magnetic unit 100 by causing the current to flow between the second electrode 402 and the third electrode 403.

For example, the magnetic memory element 10 is provided on the substrate 600.

The X-direction is, for example, a direction parallel to a major surface of the substrate.

Here, a direction parallel to the major surface of the substrate and orthogonal to the X-direction is taken as a Y-direction; and a direction orthogonal to the X-direction and the Y-direction is taken as a Z-direction.

Shift Operation of Domain Walls

An example of a shift operation of the domain walls in the magnetic memory element 10 according to the first embodiment will now be described using FIG. 2.

Figure 2:
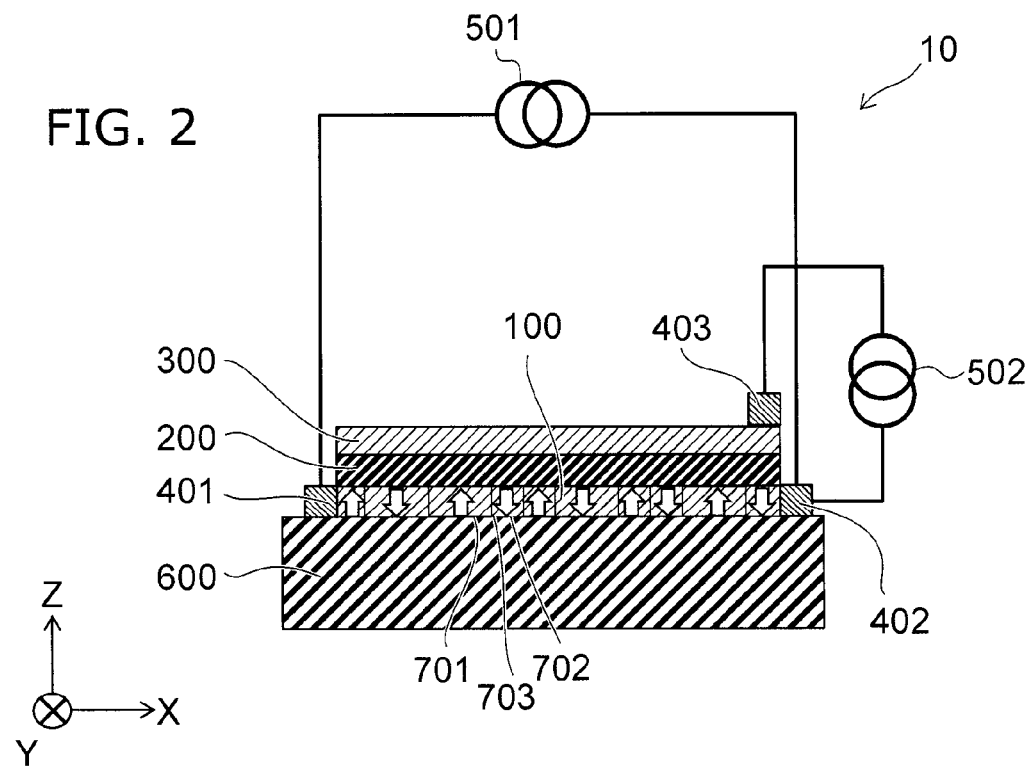
FIG. 2 is a schematic view for describing a memory operation of the magnetic memory element 10 according to the first embodiment.

FIG. 2 is a schematic view for describing a memory operation of the magnetic memory element 10 according to the first embodiment.

Multiple magnetic domains are included in the first magnetic unit 100 that extends to be continuous. For example, in the case where the easy magnetization axis of the first magnetic unit 100 is in the Z-direction as shown in FIG. 2, a magnetic domain 701 that is magnetized in the upward direction (the Z-direction) and a magnetic domain 702 that is magnetized in the downward direction (the −Z direction) exist in the first magnetic unit 100.

The first magnetic unit 100 can function as memory by associating the magnetization direction of each of the magnetic domains with "0" or "1."

A domain wall 703 exists at the boundary between the magnetic domain 701 magnetized in the upward direction and the magnetic domain 702 magnetized in the downward direction.

The multiple magnetic domains that are included in the first magnetic unit 100 are moved by the first current source 501 causing the current to flow between the first electrode 401 and the second electrode 402. By utilizing this movement, the magnetic domain to undergo recording or reproducing is moved to a position that opposes the third electrode 403 with the insulating unit 200 interposed.

The movement direction of the magnetic domains can be adjusted to be in either the same direction or the reverse direction of the current according to the material and/or layer configuration of the first magnetic unit 100.

Writing Operation

An example of the writing operation of the magnetic memory element 10 according to the first embodiment will now be described with reference to FIG. 2.

First, the case will now be described where a magnetic bit that has the same direction as the magnetization direction of the second magnetic unit 300 is written to the first magnetic unit 100.

In such a case, the current is caused to flow from the second electrode 402 toward the third electrode 403. The electrons flow in the reverse orientation of the current. Accordingly, the electrons flow from the third electrode 403 via the second magnetic unit 300, the insulating unit 200, and the first magnetic unit 100 toward the second electrode 402.

The electrons are spin-polarized when passing through the second magnetic unit 300. The spin-polarized electrons flow via the insulating unit 200 into the region of the first magnetic unit 100 where the writing is to be performed.

The spin-polarized electrons that have the spin in the same direction as the region where the writing is to be performed pass through the region where the writing is to be performed.

However, the spin-polarized electrons that have a spin in a direction different from the magnetization direction of the region where the writing is to be performed apply spin torque to the magnetization of the region where the writing is to be performed.

The spin torque that is applied to the magnetization of the region where the writing is to be performed acts to cause the magnetization direction of the region where the writing is to be performed to be in the same direction as the magnetization direction of the second magnetic unit 300.

In other words, in the case where the magnetization direction of the second magnetic unit 300 is the same as the magnetization direction of the region where the writing is to be performed, the spin-polarized electrons pass through the region where the writing is to be performed without applying spin torque. On the other hand, in the case where the magnetization direction of the second magnetic unit 300 is different from the magnetization direction of the region where the writing is to be performed, the spin-polarized electrons pass through the region where the writing is to be performed while applying spin torque.

Thus, the magnetization of the region where the writing is to be performed is controlled to be oriented in the same direction as the magnetization of the second magnetic unit 300.

The case will now be described where writing to the magnetic bits of the first magnetic unit 100 is performed in a direction different from the magnetization direction of the second magnetic unit 300. In such a case, the current that is caused to flow is in the reverse direction of the case where the writing to the magnetic bits of the first magnetic unit 100 is performed in the same direction as the magnetization direction of the second magnetic unit 300.

At this time, the electrons flow from the second electrode 402 via the first magnetic unit 100, the insulating unit 200, and the second magnetic unit 300 toward the third electrode 403.

When the electrons pass through the second magnetic unit 300, the electrons that have the spin in the same direction as the magnetization of the second magnetic unit 300 pass through the second magnetic unit 300.

However, the electrons that have a spin in a direction different from the magnetization of the second magnetic unit 300 are reflected at the interface between the second magnetic unit 300 and the insulating unit 200 and flow into the region of the first magnetic unit 100 where the writing is to be performed.

The electrons that have the spin in the direction different from the magnetization of the second magnetic unit 300 apply spin torque to the magnetization of the region of the first magnetic unit 100 where the writing is to be performed.

The spin torque that is applied to the magnetization of the region where the writing is to be performed acts to cause the magnetization direction of the region where the writing is to be performed to be in the direction different from the magnetization direction of the second magnetic unit 300.

Thus, the magnetization of the region where the writing is to be performed is controlled to be oriented in the direction different from the magnetization direction of the second magnetic unit 300.

Memory Operation: Read-Out

An example of a read-out operation of the magnetic memory element 10 according to the first embodiment will now be described with reference to FIG. 2.

When reading, a constant current is caused to flow between the second electrode 402 and the third electrode 403. A constant voltage may be applied between the second electrode 402 and the third electrode 403.

At this time, the electrical resistance between the second electrode 402 and the third electrode 403 changes due to the angle between the magnetization direction of the second magnetic unit 300 and the magnetization direction of the region of the first magnetic unit 100 where the reading is to be performed.

Specifically, the resistance value recited above is a relatively low value when the magnetization direction of the region where the reading is to be performed is the same as the magnetization direction of the second magnetic unit 300.

The resistance value recited above is a relatively high value when the magnetization direction of the region where the reading is to be performed is different from the magnetization direction of the second magnetic unit 300.

This phenomenon is called the magnetoresistance effect. By sensing the resistance value by using this phenomenon, the reading of the information is performed by sensing the magnetization direction of the region where the reading is to be performed.

Materials of Components

The first magnetic unit 100 may include various magnetic materials. For example, it is possible to use a random alloy, an ordered alloy, or a ferrimagnet.

The random alloy may be a metal including at least one type of element of Fe, Co, or Ni, or an alloy including these elements. Examples of the alloy are a NiFe alloy, a NiFeCo alloy, a CoFe alloy, a CoFeB alloy, a CoCr alloy, a CoPt alloy, a CoCrTa alloy, a CoCrPt alloy, a CoCrPtTa alloy, a CoCrNb alloy, etc. In the case where the material group recited above is used, added elements described below may be added. The random alloy is easy to make because the random alloy has an unordered structure or an amorphous structure. It is also possible to adjust the magnetic anisotropy energy and/or the saturation magnetization by adjusting the proportions of the elements included in the alloy.

The ordered alloy may be an alloy including at least one type of element of Fe, Co, or Ni and at least one type of element of Pt, Pd, Ir, Ru, or Rh. For example, the ordered alloy may be an alloy having an L10-type crystal structure such as $Co_{50}Rd_{50}$, $Co_{50}Pt_{50}$, $Fe_{50}Pt_{50}$, $Fe_{50}Rd_{50}$, $Fe_{30}Ni_{20}Pd_{50}$, $Co_{30}Fe_{10}Ni_{10}Pt_{50}$, and $Co_{30}Ni_{20}Pt_{50}$, etc. These ordered alloys are not limited to the composition ratios recited above. A stacked film of Co/Ni, Co/Pt, etc., may be used. The magnetic anisotropy energy and/or the saturation magnetization of these ordered alloys may be adjusted by adding an impurity element such as Cu, Cr, Ag, etc. Therefore, the first magnetic unit 100 having a large magnetic anisotropy energy can be obtained easily.

The ferrimagnet may be an alloy of a rare-earth metal and a transition metal. For example, an amorphous alloy including at least one type of element of Tb, Dy, or Gd and at least one type of element of transition metals such as Fe, Co, Ni, etc., may be used. Specific examples include TbFe, TbCo, TbFeCo, GdFe, GdCo, GdTbFe, GdTbCo, GdFeCo, DyFe, DyCo, DyFeCo, DyTbFeCo, etc. The magnetic anisotropy energy and the saturation magnetization of these alloys can be adjusted by adjusting the compositions. A fine crystal may be mixed inside the amorphous structure. It is favorable to use a ferrimagnet for which a small saturation magnetization can be realized as the material of the first magnetic unit 100. This is because the current necessary for the domain wall movement can be reduced by reducing the saturation magnetization.

The first magnetic unit 100 may include a combination of materials of the random alloys, the ordered alloys, and the ferrimagnets described above.

By using a layer including Pt, Ru, Pd, Ta, TaN, TiN, or W as the foundation layer when forming the materials described above as films, the perpendicular magnetic anisotropy of the first magnetic unit 100 formed on the foundation layer can be adjusted.

The magnetic properties of the magnetic materials included in the first magnetic unit 100 may be adjusted by adding a nonmagnetic element such as Ag, Cu, Au, Al, Mg, Si, Bi, Ta, B, C, O, N, Pd, Pt, Zr, Ir, W, Mo, Nb, H, etc. Various characteristics such as the crystallinity, the mechanical properties, the chemical properties, etc., may be adjusted by adding such nonmagnetic elements.

An insulating material such as $AlO_x$, AlN, AlON, MgO, MgN, $MgF_2$, $SiO_2$, SiN, SiON, $Cr_2O_3$, $Bi_2O_3$, $CaF_2$, $SrTiO_3$, $AlLaO_3$, etc., may be used as the insulating material included in the insulating unit 200.

A nonmagnetic semiconductor such as ZnO, InMn, GaN, GaAs, $TiO_2$, Zn, Te, or a material doped with such a transition metal may be used as the material of the insulating unit 200.

A dielectric material such as $BaTiO_3$, $SrTiO_3$, $PbTiO_3$, $HfO_2$, etc., may be used as the material of the insulating unit 200.

It is unnecessary for the compounds described above to have completely precise stoichiometric compositions; and deficiencies of oxygen, nitrogen, fluorine, etc., or excessive or insufficient amounts of these elements may exist.

It is favorable for the thickness of the insulating unit 200 to be shorter than the spin diffusion length of the insulating unit 200 such that the magnetostatic coupling between the second magnetic unit 300 and the first magnetic unit 100 is sufficiently small. Accordingly, it is favorable for the thickness of the insulating unit 200 to be within the range of not less than 0.2 nm and not more than 20 nm.

Figure 3:
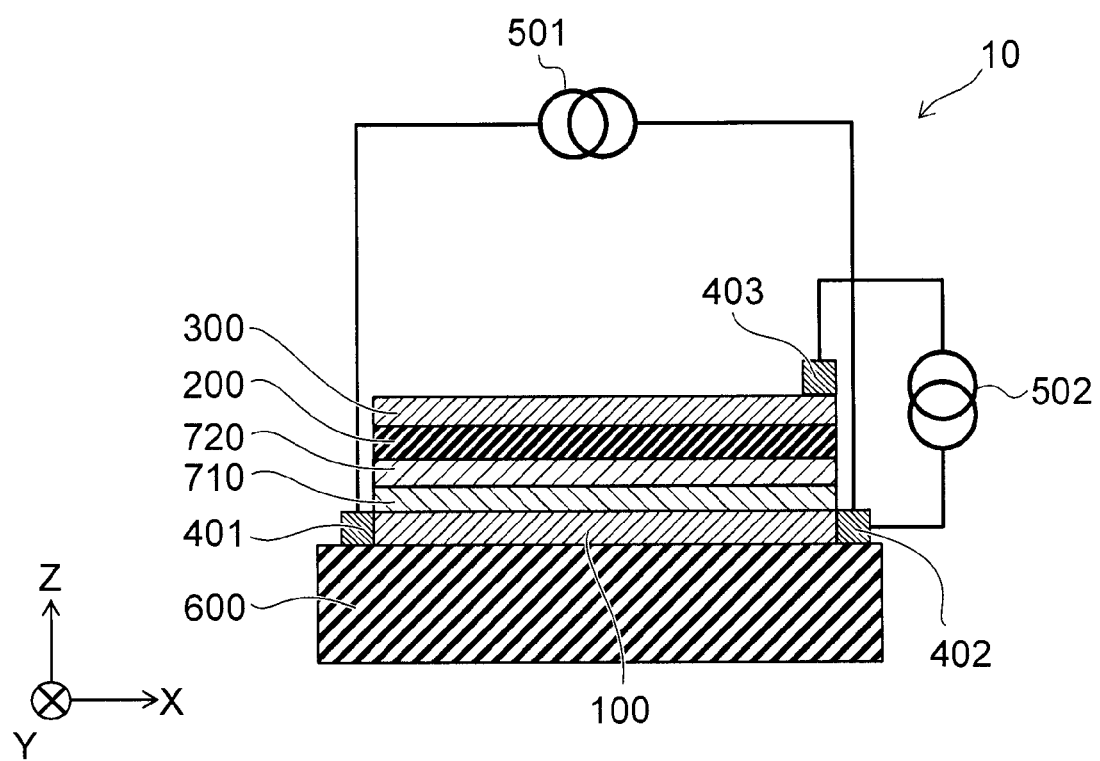
FIG. 3 is a schematic cross-sectional view showing the magnetic memory element 10 according to the first embodiment.

As shown in FIG. 3, a nonmagnetic unit 710 and a third magnetic unit 720 may be provided between the first magnetic unit 100 and the insulating unit 200. The magnetization direction of the third magnetic unit 720 is changeable.

In such a case, coupling occurs between the third magnetic unit 720 and the magnetic domains of the first magnetic unit 100 via the nonmagnetic unit 710; and the reading and writing of the magnetization direction is performed between the third magnetic unit 720 and the second magnetic unit 300. By employing such a configuration, the output when performing the read-out operation is improved; and it is possible to reduce the occurrence of writing errors when performing the writing operation.

In such a case, one element of Cu, Cr, Zn, Ga, Nb, Mo, Ru, Ta, W, Bi, V, Rh, Re, or Ir, or an alloy including at least one type of these elements may be used as the material of the nonmagnetic unit 710. The material of the third magnetic unit 720 may include various magnetic materials similar to those of the first magnetic unit 100.

The material of the first region 301 and the material of the second region 302 are selected so that the electrical resistance of the second region 302 is higher than the electrical resistance of the first region 301.

At least one of the first region 301 or the second region 302 of the second magnetic unit 300 may include various magnetic materials similar to those of the first magnetic unit 100. In such a case, the material of the at least one of the first region 301 or the second region 302 may be the same as the material of the first magnetic unit 100.

The material of the second region 302 may be the same as the material of the first region 301. Even in the case where the material of the second region 302 is the same as the material of the first region 301, the conductivity of one of the materials may be provided with anisotropy by adding an added element to the one of the materials by a method such as ion implantation, etc.

Or, the material of the second region 302 may be selected so that the conductivity of the second region 302 has anisotropy. For example, the material of the second region 302 may be selected so that the conductivity in the Z-direction of the second region 302 is not less than 10 times the conductivity in the X-direction of the second region 302.

Similarly, the conductivity of the first region 301 may be provided with anisotropy in the X-direction and the Z-direction.

To set the electrical resistance of the second region 302 to be higher than the electrical resistance of the first region 301, it is favorable for the material of the first region 301 to be conductive and for the material of the second region 302 to be insulative.

In such a case, it is more favorable for the material of the first region 301 to be a magnetic material that is conductive, and for the material of the second region 302 to be a nonmagnetic material that is insulative. In such a case, the first region 301 may include a material similar to that of the first magnetic unit 100; and the second region 302 may include a material similar to that of the insulating unit 200.

However, the material of the first region 301 may be a nonmagnetic material that is conductive; and the material of the second region 302 may be a magnetic material that is insulative. In such a case, the first region 301 may include the nonmagnetic materials described in regard to the nonmagnetic unit 710. The second region 302 may include an oxide magnetic body such as cobalt ferrite, etc.

CoCrPt may be selected as the magnetic material of the first region 301 and $SiO_2$ may be selected as the insulating material of the second region 302 as an example of the case where the conductive magnetic material is used as the first region 301 and the nonmagnetic insulating material is used as the second region 302. In such a case, if the CoCrPt and the $SiO_2$ are formed simultaneously by sputtering, etc., the CoCrPt included in the first region 301 is formed in granular configurations inside a matrix of the $SiO_2$ included in the second region 302. In other words, the first region 301 and the second region 302 are formed to be separated into two phases.

As another example, an air gap may be used as the second region 302; and the first region 301 may be a magnetic material such as an FePt alloy, etc., formed in island configurations inside the air gap.

Details of Second Magnetic Unit

Details of the second magnetic unit 300 will now be described using FIGS. 4A to 4C.

Figure 4A:
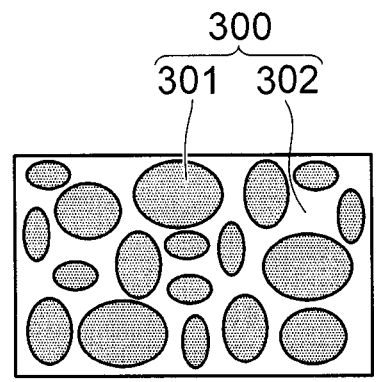
FIGS. 4A to 4C show the first region 301 and the second region 302 of the second magnetic unit 300 when the second magnetic unit 300 is as viewed from the upper surface.
Figure 4B:
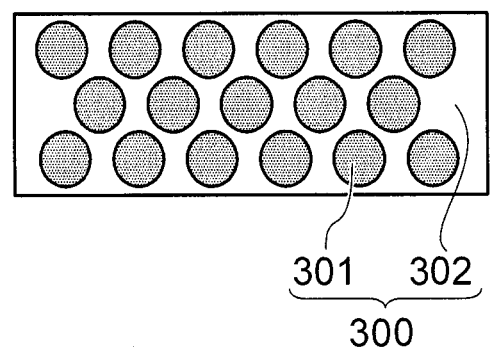
Figure 4C:
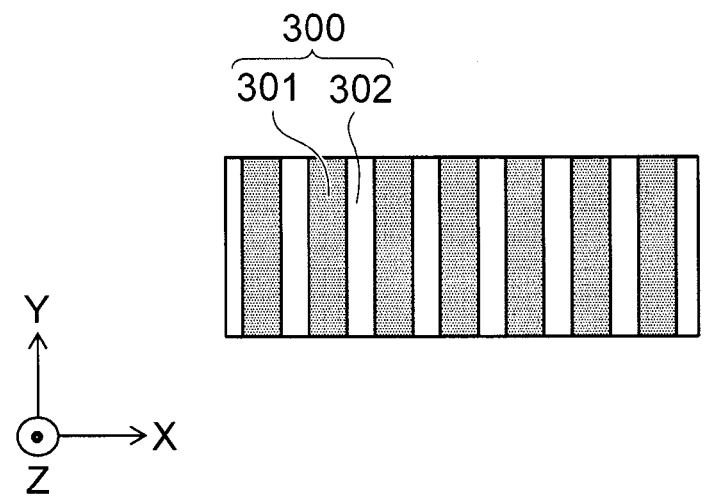

FIGS. 4A to 4C are schematic views showing the first region 301 and the second region 302 of the second magnetic unit 300.

FIGS. 4A to 4C show the first region 301 and the second region 302 of the second magnetic unit 300 when the second magnetic unit 300 is as viewed from the upper surface.

In the case where CoCrPt is selected as the material of the first region 301 and $SiO_2$ is selected as the material of the second region 302, multiple first regions 301 are provided inside the second region 302 as shown in FIG. 4A. In such a case, the multiple first regions 301 are provided to be separated from each other by the second region 302.

As shown in FIG. 4B, the second magnetic unit 300 may have a configuration in which the first regions 301 are provided in dot configurations and the second region 302 is filled around the first regions 301.

The configuration of the first regions 301 and the second region 302 shown in FIG. 4B can be made using, for example, self assembly (directed self-assembly (DSA)) of a diblock copolymer, etc., described below. It is also possible to make such a configuration using a method such as EB lithography, etc.

In the case where one of the first region 301 or the second region 302 is a magnetic material, it is favorable for the regions that are formed in the dot configurations to be provided at substantially uniform spacing inside the second magnetic unit 300. It is possible for the reading and writing of the magnetic memory element 10 to be more stable by having such a configuration.

The configuration shown in FIG. 4B is more favorable than the configuration shown in FIG. 4A because the spacing of the first regions 301 provided in the dot configurations is more uniform.

As shown in FIG. 4C, the first region 301 and the second region 302 may have a structure in which the first region 301 and the second region 302 are arranged in a stripe configuration. The structure shown in FIG. 4C also can be formed using DSA or a method such as EB lithography, etc.

In the case where one of the first region 301 or the second region 302 is a magnetic material, the output of the reading and writing of the magnetic memory element can be controlled by controlling the pitch of the stripes.

As shown in FIG. 4C, it is favorable for the structure in which the first region 301 and the second region 302 are arranged in the stripe configuration to be arranged in the direction in which the second magnetic unit 300 extends. In other words, it is favorable for the second magnetic unit 300 to include the multiple first regions 301 and the multiple second regions 302, and for the first regions 301 and the second regions 302 to be provided alternately in the direction in which the second magnetic unit 300 extends.

By employing such a configuration, the current that flows in the extension direction of the second magnetic unit 300 when shifting the domain walls of the first magnetic unit 100 can be reduced further.

As a result, it is possible to reduce the power consumption when operating the magnetic memory element.

Example of Manufacturing Method

An example of the method for manufacturing the magnetic memory element 10 according to the first embodiment will now be described using FIG. 5A to FIG. 6B.

FIG. 5A to FIG. 6B are cross-sectional views of processes, showing manufacturing processes of the magnetic memory element 10 according to the first embodiment.

Figure 5A:
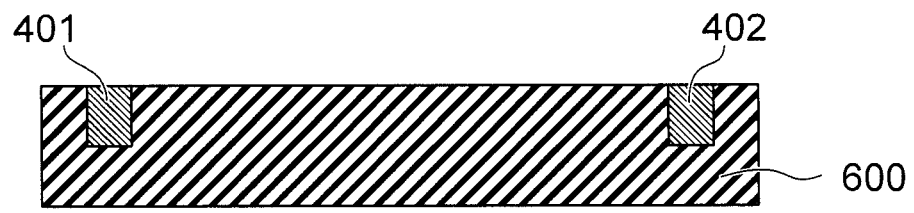
FIG. 5A to FIG. 6B are cross-sectional views of processes, showing manufacturing processes of the magnetic memory element 10 according to the first embodiment.

First, as shown in FIG. 5A, the first electrode 401 and the second electrode 402 are formed on the substrate 600 in which the structures necessary for the memory operation such as transistors, interconnects, etc., are provided.

The first electrode 401 and the second electrode 402 may be multiply arranged in the X-direction and the Y-direction on the substrate 600.

Figure 5B:
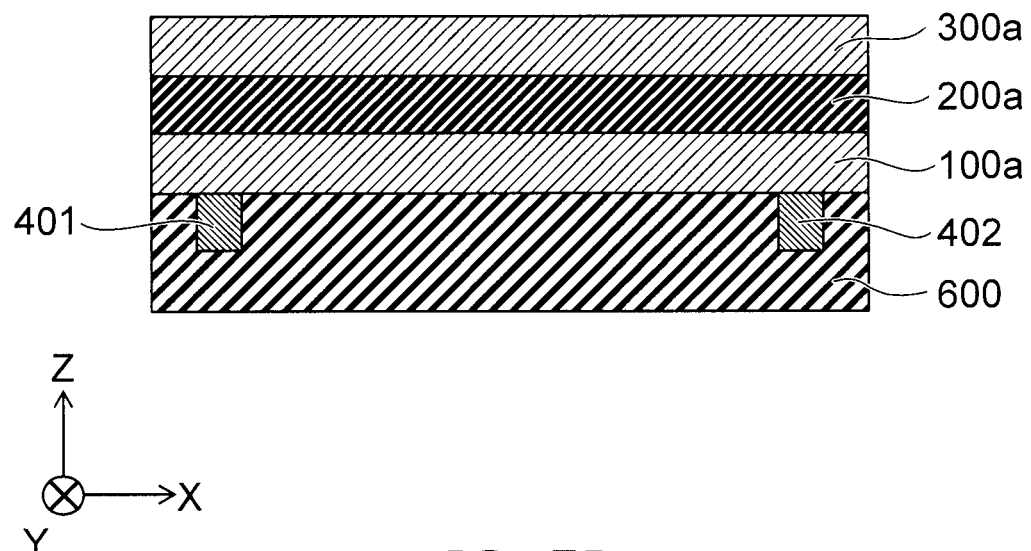

Then, as shown in FIG. 5B, a first magnetic unit 100a, an insulating unit 200a, and a second magnetic unit 300a are formed on the substrate 600 in which the first electrode 401 and the second electrode 402 are formed.

It is favorable to form the layers using PVD (Physical Vapor Deposition) such as vapor deposition, sputtering, etc., because continuous formation is possible in a vacuum, the film formation rate is fast, and the control of the film quality is relatively easy. However, it is also possible to use CVD (Chemical Vapor Deposition), ALD (Atomic Layer Deposition), or plating (wet film formation).

The materials of the components are appropriately selected from the various materials described above.

A foundation layer for adjusting the magnetic properties may be formed prior to forming the first magnetic unit 100a as a film. Pt, Pd, Ru, etc., may be used as the material of the foundation layer.

After forming the second magnetic unit 300a as a film, a capping layer for protecting the formed stacked body may be formed. Pt, Ta, etc., may be used as the material of the capping layer.

Then, a photoresist is formed on the second magnetic unit 300a; and a mask is formed using photolithography.

Figure 6A:
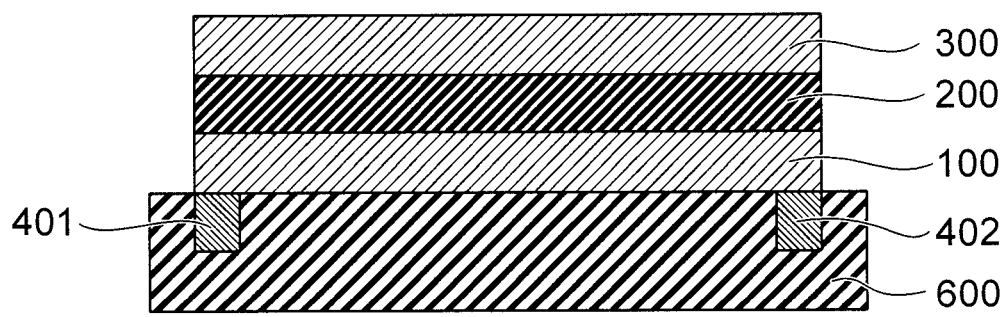

Using the mask, etching or milling of the first magnetic unit 100a, the insulating unit 200a, and the second magnetic unit 300a is performed until the surface of the substrate 600 is exposed by RIE (Reactive Ion Etching), ion milling, etc. By this process, the first magnetic unit 100, the insulating unit 200, and the second magnetic unit 300 shown in FIG. 6A are obtained.

At this time, for example, the region where each component is removed is adjusted so that the first electrode 401 and the second electrode 402 that are provided on the substrate 600 are positioned at two ends of the first magnetic unit 100.

Then, a metal layer is formed by forming an electrode material as a film on the second magnetic unit 300.

Then, a photoresist is formed on the metal layer; and a mask is formed.

Figure 6B:
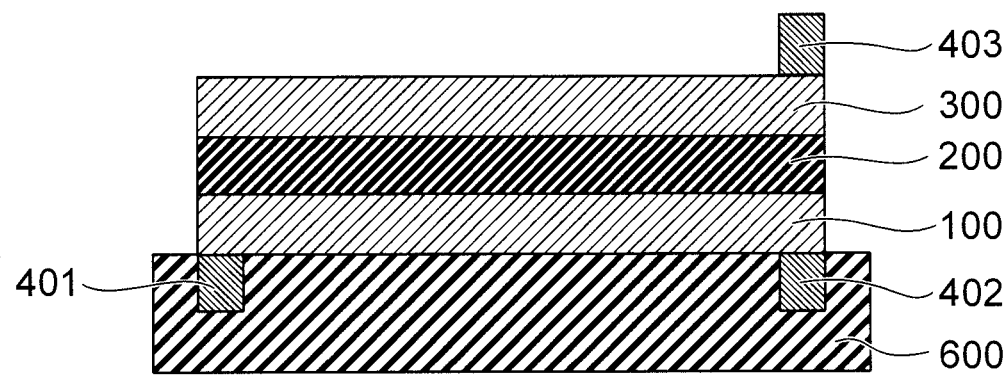
Figure 6B:
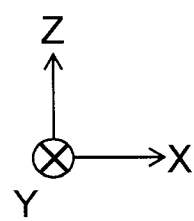

Subsequently, as shown in FIG. 6B, the metal layer is patterned until the surface of the second magnetic unit 300 is exposed by RIE, ion milling, etc., using the mask. In other words, the metal layer is patterned so that a part of the second magnetic unit 300 is positioned between the third electrode 403 and a part of the insulating unit 200.

In the example shown in FIG. 6B, the metal layer is patterned so that the surface area in the XY plane of the third electrode 403 is less than the surface area in the XY plane of the second magnetic unit 300.

In the case where the capping layer is provided on the second magnetic unit 300, the metal layer is etched until the capping layer is exposed.

For example, when patterning the metal layer, the region where the metal layer is removed is adjusted so that the third electrode 403 is positioned at the vicinity of the second electrode 402 provided on the substrate 600.

The magnetic memory element 10 shown in FIG. 1 is obtained by the processes described above.

Other Example of Manufacturing Method

Another example of the method for manufacturing the magnetic memory element 10 according to the first embodiment will now be described with reference to FIG. 5A to FIG. 6B.

First, the first electrode 401 and the second electrode 402 are formed on the substrate 600 by implementing the process shown in FIG. 5A described above.

Then, the first magnetic unit 100a and the insulating unit 200a are formed on the substrate 600 in which the first electrode 401 and the second electrode 402 are provided.

Subsequently, a self-assembly unit 302 is formed as shown in FIG. 5B by coating a self-assembly material such as a diblock copolymer, etc., on the insulating unit 200a. At this time, the self-assembly unit 302 includes a matrix and a pattern of the spherical configurations provided inside the matrix such as that shown in FIG. 4B.

For example, the self-assembly unit 302 is formed by coating a mixed material of polystyrene (PS) and polyethylene oxide (PEO)-SOG (silicon-on-glass). By annealing the layer for 12 hours at 200° C., a pattern is formed in which PS spheres having a diameter of 20 nm are separated from each other inside a PEO-SOG matrix.

Then, the phase that has the spherical configurations inside the self-assembly unit 302 is removed to form a self-assembly unit having multiple openings.

In the example described above, the PS that is inside the PEO-SOG matrix is removed using oxygen plasma in an ICP etching apparatus. For example, a chamber pressure of 0.015 Pa, an antenna power of 100 W, and a bias power of 100 W may be used as the conditions when using oxygen gas. By this process, the PS that is formed in hole configurations inside the PEO-SOG matrix is removed; and a PEO-SOG layer is formed in which multiple openings are provided.

Then, by filling a magnetic material into the interiors of the holes made in the self-assembly unit, the second magnetic unit 300a is obtained in which the first region 301 that includes the magnetic material is dispersed in a matrix of the second region 302 including SOG. At this time, a capping layer for protecting the second magnetic unit 300a may be formed.

A material similar to the material included in the first magnetic unit 100 may be used as the magnetic material filled into the holes of the self-assembly unit.

Subsequently, the magnetic memory element 10 shown in FIG. 1 is obtained by forming the first magnetic unit 100, the insulating unit 200, the second magnetic unit 300, and the third electrode 403 by implementing the processes shown in FIGS. 6A and 6B described above.

Operations and Effects of Embodiment

The operations and effects of the magnetic memory element according to the embodiment and the operations and effects of the method for manufacturing the magnetic memory element according to the embodiment will now be described.

First, a case is considered as a comparative example of the embodiment where a fixed magnetic unit and a metal layer are formed on a patterned insulating unit, and the fixed magnetic unit and the metal layer are patterned.

In such a case, when patterning, there is a possibility that great damage of the magnetic unit may occur due to ions, etc., used in the patterning when the film thickness of the fixed magnetic unit becomes thin, when the surface of the insulating unit is exposed, etc.

Even in the case where the damage of the magnetic unit is reduced by forming the metal layer on a patterned insulating unit and a patterned fixed magnetic unit and by patterning only the metal layer, the current that flows through the fixed magnetic unit undesirably becomes large when the shift current is caused to flow if the fixed magnetic unit does not include the second region including the insulating material.

In the manufacturing method according to the embodiment described above, at least a part of the insulating unit 200 is covered with the second magnetic unit 300 when patterning the metal layer formed on the second magnetic unit 300. Therefore, it is possible to reduce the damage of the first magnetic unit 100 when forming the third electrode 403 by patterning the metal layer.

The second magnetic unit 300 that includes the first region including a conductive material and the second region including an insulating material is formed as the second magnetic unit 300 in the manufacturing method according to the embodiment. Therefore, even in the case where the second magnetic unit 300 that has a larger surface area than the third electrode 403 is formed on the insulating unit 200 to reduce the damage of the first magnetic unit 100, the current that flows through the second magnetic unit 300 when the shift current is caused to flow in the magnetic memory element that is made can be reduced. As a result, it is possible to reduce the power consumption of the magnetic memory element.

Similarly, in the magnetic memory element according to the embodiment, the second magnetic unit 300 includes the first region that includes a conductive material and the second region that includes an insulating material. Therefore, even in the case where the second magnetic unit 300 is provided on the insulating unit 200 and the third electrode 403 is provided on a part of the second magnetic unit 300, the current that flows through the second magnetic unit 300 when shifting the domain walls of the first magnetic unit 100 can be reduced. As a result, it is possible to reduce the power consumption of the magnetic memory element.

In the magnetic memory element according to the embodiment, it is favorable for the distance between the second electrode 402 and the third electrode 403 to be shorter than the distance between the first electrode 401 and the third electrode 403.

This is because more magnetic domains can be written continuously to the first magnetic unit 100 as the distance between the first electrode 401 and the third electrode 403 increases.

Therefore, for example, it is favorable for the third electrode 403 to be provided at a position opposing the second electrode 402 with the first magnetic unit 100, the insulating unit 200, and the second magnetic unit 300 interposed. In such a case, a part of the first magnetic unit 100, a part of the insulating unit 200, and a part of the second magnetic unit 300 are provided between the second electrode 402 and the third electrode 403.

Second Embodiment

A magnetic memory element 20 according to a second embodiment will now be described using FIG. 7.

Figure 7:
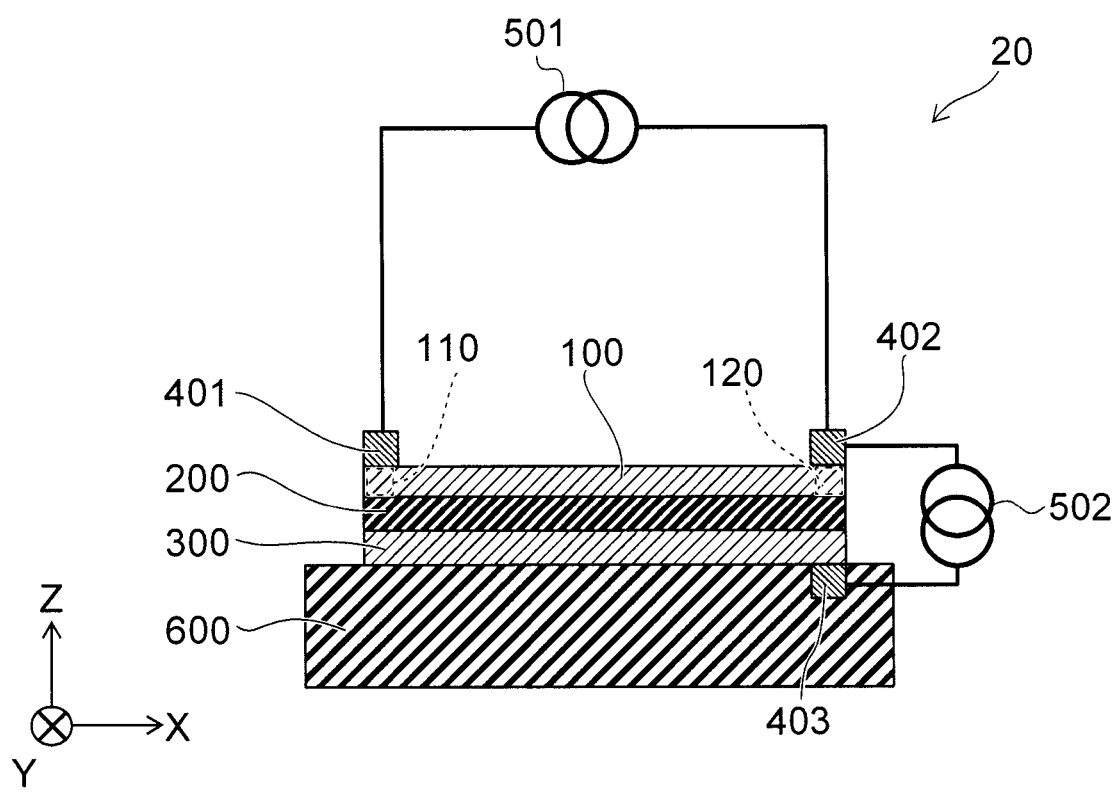
FIG. 7 is a schematic cross-sectional view showing the magnetic memory element 20 according to the second embodiment.

FIG. 7 is a schematic cross-sectional view showing the magnetic memory element 20 according to the second embodiment.

Compared to the magnetic memory element 10 according to the first embodiment, the order of the components in the Z-direction is different for the magnetic memory element 20 according to the second embodiment.

In the magnetic memory element 10, the first electrode 401 and the second electrode 402 are provided on the substrate 600; and the first magnetic unit 100, the insulating unit 200, and the second magnetic unit 300 are provided in this order on these electrodes.

Conversely, in the magnetic memory element 20 as shown in FIG. 7, first, the third electrode 403 is provided on the substrate 600.

The second magnetic unit 300 is provided on the third electrode 403 in the Z-direction.

The surface area in the XY plane of the third electrode 403 is less than the surface area in the XY plane of the second magnetic unit 300.

The second magnetic unit 300 extends in the X-direction. For example, the third electrode 403 is connected to the end portion in the X-direction of the second magnetic unit 300.

Similarly to the magnetic memory element 10, the second magnetic unit 300 includes the first region 301 and the second region 302.

The insulating unit 200 is provided on the second magnetic unit 300. One section of the second magnetic unit 300 is provided between the third electrode 403 and a part of the insulating unit 200.

The first magnetic unit 100 is provided on the insulating unit 200.

The first magnetic unit 100 extends in the X-direction and includes multiple magnetic domains in the X-direction.

The first electrode 401 is provided on the first portion 110 of the first magnetic unit 100.

The second electrode 402 is provided on the second portion 120 of the first magnetic unit 100.

The second electrode 402 is provided at a position proximal to the third electrode 403.

The first electrode 401 and the second electrode 402 are connected to the first current source 501. The second electrode 402 and the third electrode 403 are connected to the second current source 502.

The shift operation of the magnetic domains, the read-out operation of the magnetization direction of the magnetic domains, and the writing operation of the magnetic domains for the magnetic memory element 20 are similar to those of the magnetic memory element 10 of the first embodiment.

In the magnetic memory element 20 according to the embodiment as well, similarly to the first embodiment, because the second magnetic unit 300 that is provided on at least a part of the insulating unit 200 includes the second region 302, it is possible to reduce the current flowing through the second magnetic unit 300 when the shift current is caused to flow.

Third Embodiment

A magnetic memory element 30 according to a third embodiment will now be described using FIG. 8.

Figure 8:
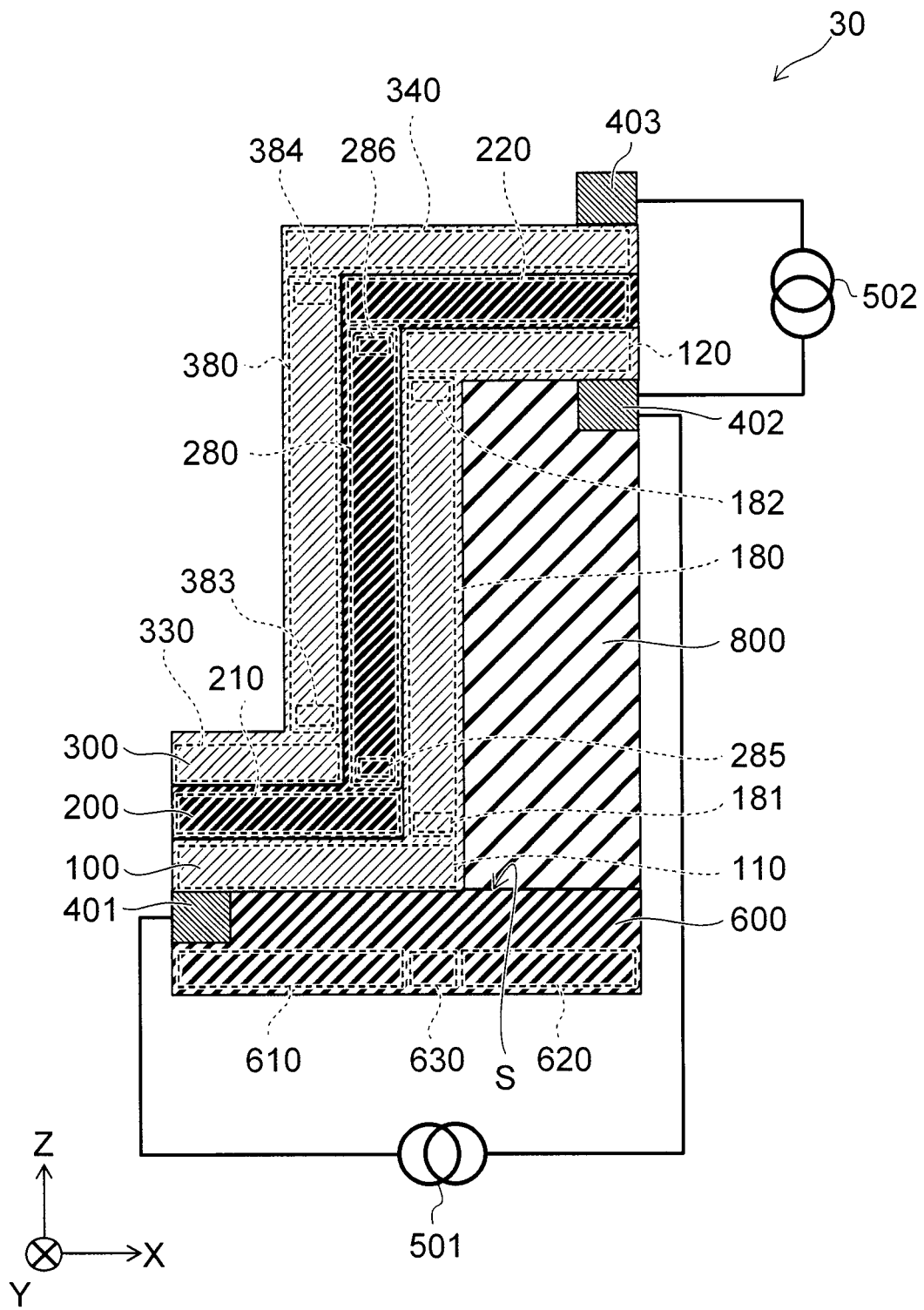
FIG. 8 is a schematic cross-sectional view showing the magnetic memory element 30 according to the third embodiment.

FIG. 8 is a schematic cross-sectional view showing the magnetic memory element 30 according to the third embodiment.

The first magnetic unit 100 includes the first portion 110, the second portion 120, and a first extension portion 180.

The first extension portion 180 includes a first connection region 181 that is connected to the first portion 110, and a second connection region 182 that is connected to the second portion 120. The second connection region 182 is separated from the first connection region 181 in the Z-direction.

In other words, the first portion 110 is connected to one end in the Z-direction of the first extension portion 180; and the second portion 120 is connected to one other end in the Z-direction of the first extension portion 180.

The first extension portion 180 includes multiple magnetic domains. The multiple magnetic domains that are included in the first extension portion 180 are arranged in the Z-direction.

The first portion 110 may include multiple magnetic domains. In the case where the first portion 110 includes the multiple magnetic domains, the multiple magnetic domains are arranged in the X-direction. The first portion 110 may include only a single magnetic domain.

Similarly, the second portion 120 may include multiple magnetic domains. In the case where the second portion 120 includes the multiple magnetic domains, the multiple magnetic domains are arranged in the X-direction. The second portion 120 may include only a single magnetic domain.

The first extension portion 180 and at least a part of the first portion 110 do not overlap in the Z-direction. Similarly, the first extension portion 180 and at least a part of the second portion 120 do not overlap in the Z-direction.

The insulating unit 200 includes a first insulating portion 210, a second insulating portion 220, and a second extension portion 280.

The first insulating portion 210 is provided on a part of the first portion 110. In other words, the first insulating portion 210 and a part of the first portion 110 overlap in the Z-direction.

One section of the second insulating portion 220 is provided on the second portion 120. In other words, the second portion 120 and a part of the second insulating portion 220 overlap in the Z-direction.

One section of the second extension portion 280 is provided on the first extension portion 180. In other words, the first extension portion 180 and a part of the second extension portion 280 overlap in the X-direction. The second extension portion 280 extends in the Z-direction.

The second extension portion 280 includes a fifth connection region 285 that is connected to the first insulating portion 210, and a sixth connection region 286 that is connected to the second insulating portion 220. The fifth connection region 285 is separated from the sixth connection region 286 in the Z-direction.

In other words, the first insulating portion 210 is connected to one end in the Z-direction of the second extension portion 280; and the second insulating portion 220 is connected to one other end in the Z-direction of the second extension portion 280.

The second magnetic unit 300 includes a third portion 330, a fourth portion 340, and a third extension portion 380.

The third portion 330 is provided on a part of the first insulating portion 210. In other words, the third portion 330, a part of the first portion 110, a part of the first insulating portion 210, and the first electrode 401 overlap in the Z-direction.

One section of the fourth portion 340 is provided on the second insulating portion 220. In other words, the second portion 120, the second insulating portion 220, the second electrode 402, and a part of the fourth portion 340 overlap in the Z-direction.

One section of the third extension portion 380 is provided on the second extension portion 280. In other words, the second extension portion 280, the first extension portion 180, and a part of the third extension portion 380 overlap in the X-direction. The third extension portion 380 extends in the Z-direction.

The third extension portion 380 includes a third connection region 383 that is connected to the third portion 330, and a fourth connection region 384 that is connected to the fourth portion 340. The third connection region 383 is separated from the fourth connection region 384 in the Z-direction.

In other words, the third portion 330 is connected to one end in the Z-direction of the third extension portion 380; and the fourth portion 340 is connected to one other end in the Z-direction of the third extension portion 380.

For example, the magnetic memory element 30 is provided on the substrate 600.

The substrate 600 includes a first substrate region 610, a second substrate region 620, and a third substrate region 630.

The second substrate region 620 is separated from the first substrate region 610 in the X-direction.

The third substrate region 630 is provided between the first substrate region 610 and the second substrate region 620.

The first portion 110 is provided on a surface S of the substrate 600. The first portion 110 and at least a part of the first substrate region 610 overlap in the Z-direction.

An insulating unit 800 is further provided on the surface S of the substrate 600. The first portion 110 and the insulating unit 800 are provided at mutually-different positions on the surface S of the substrate 600. The insulating unit 800 and at least a part of the second substrate region 620 overlap in the Z-direction.

The second portion 120 is provided on the insulating unit 800. The second portion 120 and at least a part of the second substrate region 620 overlap in the Z-direction. Accordingly, at least a part of the second portion 120 is provided between the insulating unit 200 and the insulating unit 800.

The first extension portion 180 is provided on the side surface of the insulating unit 800. The first extension portion 180 and the insulating unit 800 overlap in the X-direction. The first extension portion 180 and at least a part of the third substrate region 630 overlap in the Z-direction.

The first electrode 401 is provided on the first substrate region 610.

The second electrode 402 is provided on the insulating unit 800. In other words, the second electrode 402 is provided between the insulating unit 800 and the second portion 120.

The third electrode 403 is provided on the fourth portion 340 of the second magnetic unit 300.

The direction of the easy magnetization axis of the first extension portion 180 is aligned with the X-direction. Or, the direction of the easy magnetization axis of the first extension portion 180 is aligned with the Z-direction.

Here, a direction that is aligned with the X-direction is a direction that has an angle to the X-direction that is less than 45 degrees. Similarly, a direction that is aligned with the Z-direction is a direction that has an angle to the Z-direction that is less than 45 degrees.

The direction of the easy magnetization axis of the first portion 110 is aligned with the X-direction or aligned with the Z-direction.

Similarly, the direction of the easy magnetization axis of the second portion 120 is aligned with the X-direction or aligned with the Z-direction.

As an example, the directions of the easy magnetization axis of the first portion 110 and the easy magnetization axis of the second portion 120 are aligned with the X-direction; and the direction of the easy magnetization axis of the first extension portion 180 is aligned with the X-direction.

By employing such a configuration, the energy of the domain walls can be reduced at the connection portion between the first portion 110 and the first extension portion 180 and at the connection portion between the first extension portion 180 and the second portion 120. As a result, it is possible to move the domain walls at these connection portions using less energy.

It is favorable for the direction of the easy magnetization axis of the second magnetic unit 300 to be aligned with the direction of the easy magnetization axis of the second portion 120 provided between the second electrode 402 and the third electrode 403.

It is more favorable for the direction of the easy magnetization axis of the second magnetic unit 300 to be parallel to the direction of the easy magnetization axis of the second portion 120.

By employing such a configuration, it is possible to perform the read-out operation of the magnetic domains of the first magnetic unit 100 and the writing operation of the magnetic domains to the first magnetic unit 100 more stably.

The operations of moving the domain walls, reading the magnetic domains of the first magnetic unit 100, and writing the magnetic domains to the first magnetic unit 100 for the magnetic memory element 30 are similar to the operations of the magnetic memory element 10 according to the first embodiment.

A method for manufacturing the magnetic memory element 30 according to the third embodiment will now be described using FIG. 9A to FIG. 12B.

FIG. 9A to FIG. 12B are views of processes, showing manufacturing processes of the magnetic memory element 30 according to the third embodiment.

Figure 9A:
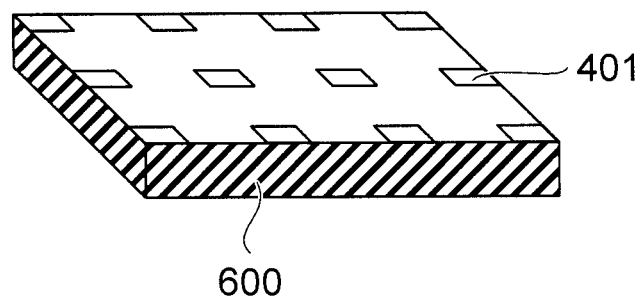
FIG. 9A to FIG. 12B are views of processes, showing manufacturing processes of the magnetic memory element 30 according to the third embodiment.

First, as shown in FIG. 9A, the first electrode 401 is formed on the substrate 600 in which the structures necessary for the memory operations such as transistors, interconnects, etc., are provided. For example, the first electrode 401 is multiply formed in the X-direction and the Y-direction on the substrate 600.

Then, an insulating unit 800a is formed on the multiple first electrodes 401. It is favorable to use PVD such as vapor deposition, sputtering, etc., having a fast film formation rate as the film formation method of the insulating unit 800a. However, it is also possible to use CVD or ALD. It is possible to use $SiO_2$, SiN, $Al_2O_3$, etc., as the material of the insulating unit 800a.

The insulating unit 800a may be formed by alternately stacking two or more layers having mutually-different etching rate anisotropies. Thereby, it is possible to form pinched-in portions periodically in the Z-direction in the side walls of an opening OP1 and an opening OP2 made subsequently.

Then, for example, an opening that extends in the Y-direction is made by patterning the surface of the insulating unit 800a by RIE using a resist mask patterned into a line & space pattern in the X-direction. Then, a metal layer is formed on the surface of the insulating unit 800a; and the excessive metal material other than the metal material that is deposited in the opening interior is removed by, for example, CMP (Chemical-Mechanical Polishing). By this process, second electrodes 402a that are filled into the surface of the insulating unit 800 are formed.

Figure 9B:
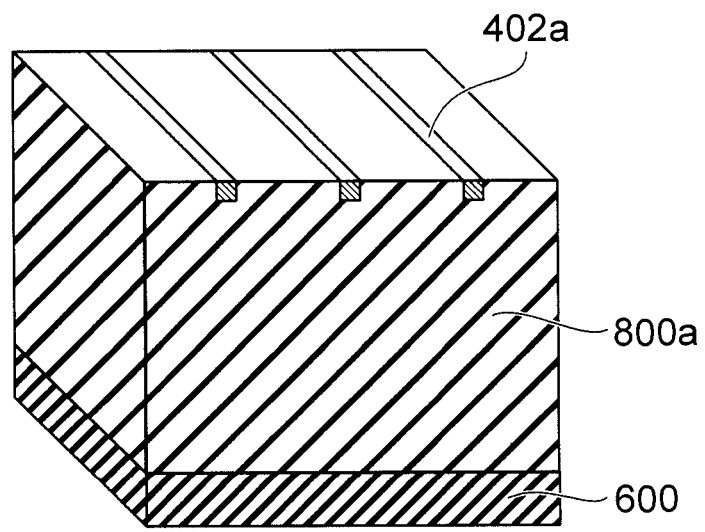

The state at this time is shown in FIG. 9B.

The second electrodes 402a may be formed by forming a metal layer on the surface of the insulating unit 800a and by patterning the metal layer without making the opening in the insulating unit 800a.

Figure 9C:
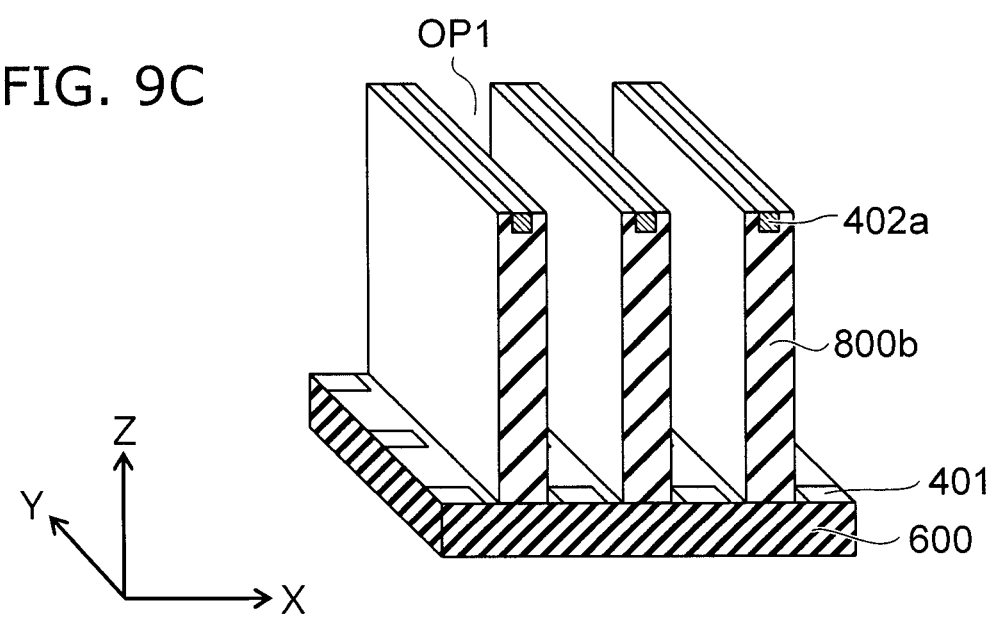

Then, as shown in FIG. 9C, the opening OP1 that extends in the Y-direction is made in the region of the insulating unit 800a where the second electrodes 402a are not provided. For example, the opening OP1 is made by patterning the insulating unit 800a by RIE using a resist mask patterned into a line & space pattern in the X-direction.

The first electrodes 401 are exposed by this process. Further, by this process, multiple insulating units 800b that are separated from each other in the X-direction are formed.

At this time, as an example, the second electrode 402a is positioned between the first electrodes 401 adjacent to each other in the X-direction when viewed in plan.

"When viewed in plan" means the case of viewing from a direction (the Z-direction) perpendicular to the surface of the substrate.

Then, the first magnetic unit 100a is formed on the first electrodes 401, on the insulating units 800b, and on the second electrodes 402a.

For example, the first magnetic unit 100a is formed using CVD or ALD. A precursor that includes one or more elements included in the materials of the layers is used in CVD and ALD. Multiple precursors are used when forming an alloy layer.

A foundation layer may be formed prior to forming the first magnetic unit 100a as a film. For example, the first magnetic unit 100a may be formed uniformly as a film over the entire surface of the substrate. For example, the adhesion between the first magnetic unit 100a and the insulating unit 800b and the magnetic properties of the first magnetic unit 100a can be adjusted.

It is favorable to use a material such as W, TaN, etc., having a surface energy that is higher than that of the magnetic material as the material of the foundation layer to improve the adhesion between the first magnetic unit 100a and the insulating unit 800b. Pt, Pd, Ru, etc., may be used as the material of the foundation layer to adjust the magnetic properties of the first magnetic unit 100a.

Then, the insulating unit 200a is formed on the first magnetic unit 100a; and the second magnetic unit 300a is formed on the insulating unit 200a. At this time, the insulating unit 200a is formed on the first magnetic unit 100a so that the insulating unit 200a and the second electrode 402a overlap when viewed in plan. The second magnetic unit 300a also is formed on the insulating unit 200a so that the second magnetic unit 300a and the second electrode 402a overlap when viewed in plan.

The second magnetic unit 300a includes the first region 301 and the second region 302.

Figure 10A:
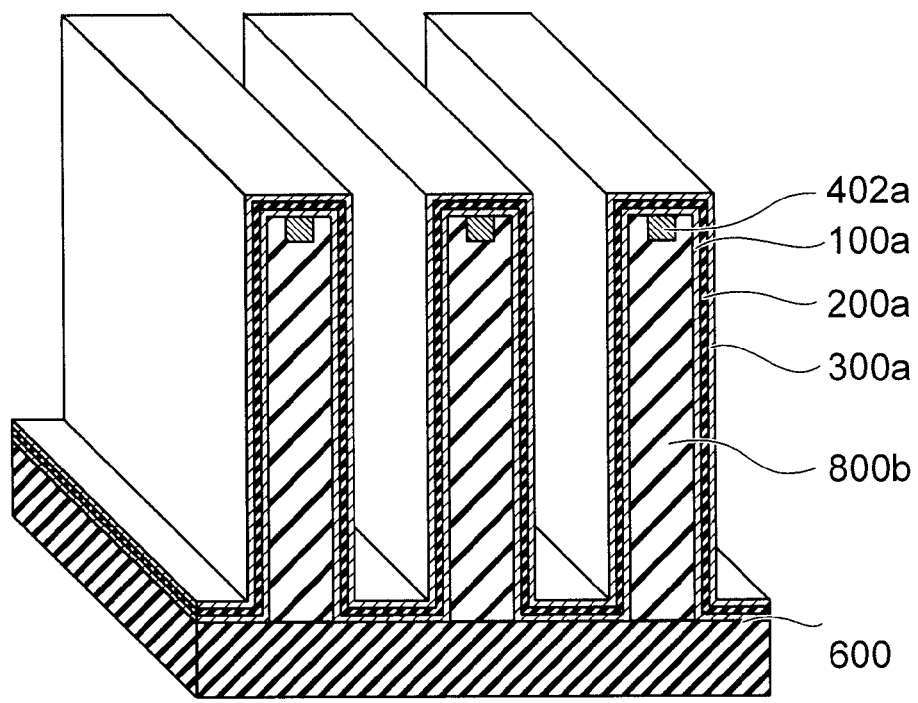

The state at this time is shown in FIG. 10A.

A capping layer may be formed after forming the second magnetic unit 300a as a film. Pt, Ta, etc., may be used as the material of the capping layer.

Here, it is favorable for the second magnetic unit 300a to be formed using sputtering or vapor deposition to more easily form a structure such as that shown in FIGS. 5A and 5B in which one of the first region 301 or the second region 302 is a matrix and the other is dispersed in the matrix.

The thickness of the first magnetic unit 100a, the thickness of the insulating unit 200a, and the thickness of the second magnetic unit 300a are sufficiently thin compared to the width (the dimension in the X-direction) and the depth (the dimension in the Z-direction) of the opening OP1. Therefore, the opening OP1 remains after forming the first magnetic unit 100a, the insulating unit 200a, and the second magnetic unit 300a.

Figure 10B:
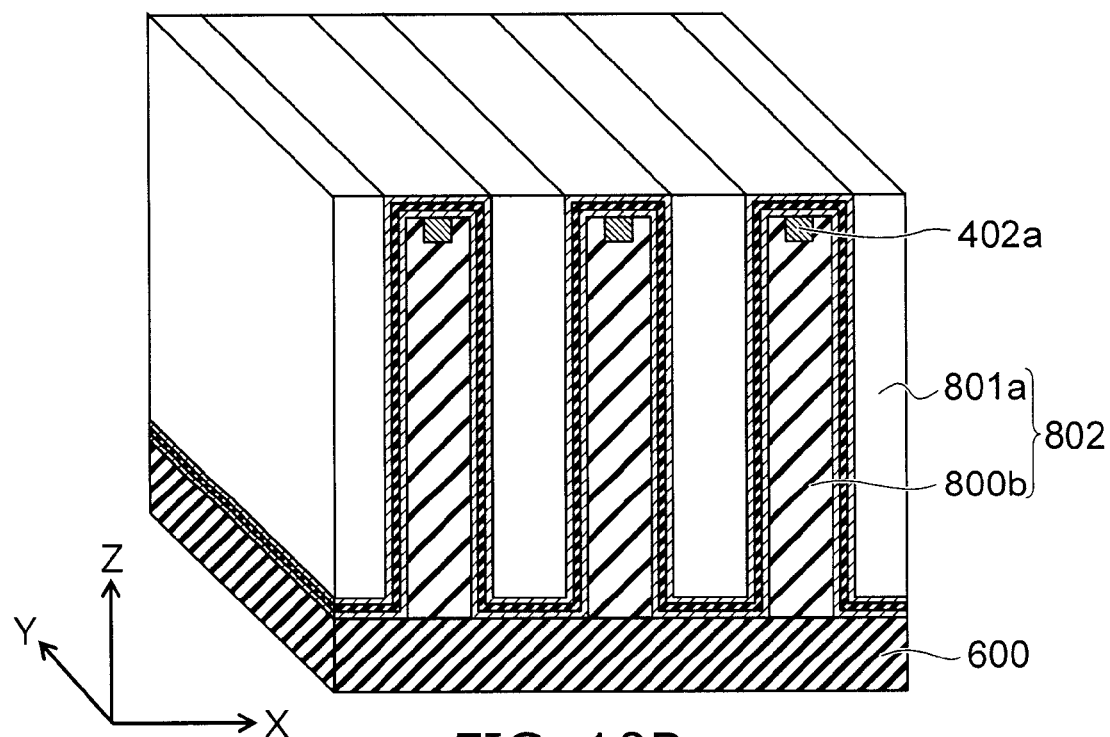

Then, as shown in FIG. 10B, an insulating unit 801a is formed to fill the first opening OP1. A method similar to that of the formation of the insulating unit 800a may be used to form the insulating unit 801a. A material similar to the insulating unit 800a may be used as the material of the insulating unit 801a.

In the case where excessive insulating material exists on the surface after the first opening OP1 is filled, the excessive insulating material may be removed and the surface may be flattened by a method such as CMP, etc.

In such a case, the structure is such that the first magnetic unit 100a, the insulating unit 200a, and the second magnetic unit 300a are buried in a first insulative structure body 802 made of the insulating unit 800b and the insulating unit 801a.

Figure 11A:
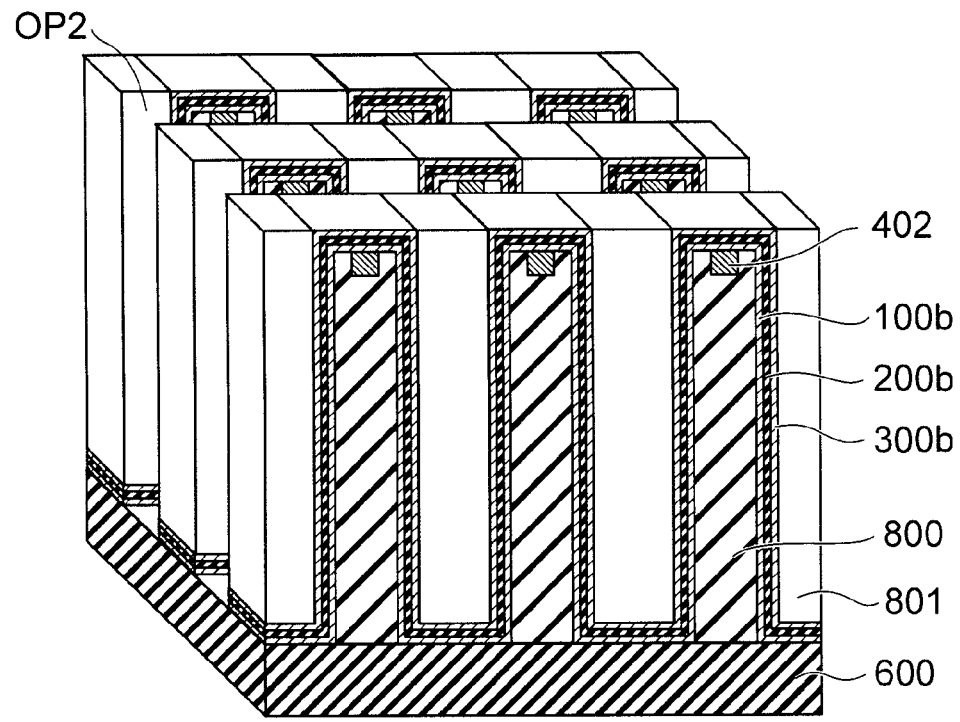

Then, as shown in FIG. 11A, the second opening OP2 that extends in the X-direction is made in the first insulative structure body 802 made of the insulating unit 800b and the insulating unit 801a. For example, the opening OP2 is made by patterning the first insulative structure body 802 by RIE using a resist mask patterned into a line & space pattern in the Y-direction. At this time, the first insulative structure body 802 is patterned until the substrate 600 is exposed. The resist mask is formed on the first insulative structure body 802 so that the first electrodes 401 are not exposed when making the opening OP2 by patterning the first insulative structure body 802. Specifically, the resist mask is formed at positions not overlapping the first electrode 401 when viewed in plan.

By this process, a first magnetic unit 100b is formed by dividing the first magnetic unit 100a into a plurality in the Y-direction. Similarly, the second electrode 402, an insulating unit 200b, and a second magnetic unit 300b are formed by dividing the second electrode 402a, the insulating unit 200a, and the second magnetic unit 300a into pluralities in the Y-direction.

Also, by this process, the multiple insulating units 800 and multiple insulating units 801 that are separated from each other in the Y-direction are formed.

Figure 11B:
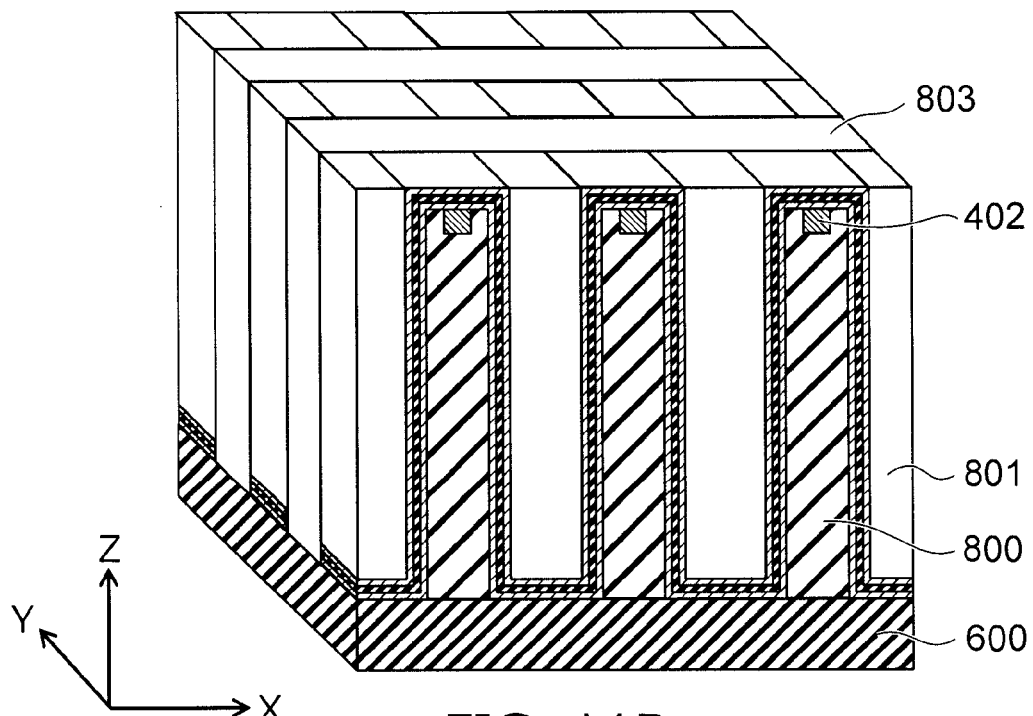

Then, as shown in FIG. 11B, the second opening OP2 is filled by forming an insulating unit 803. A method similar to the formation of the insulating unit 800a may be used to form the insulating unit 803. A material similar to that of the insulating unit 800a may be used as the material of the insulating unit 803.

In the case where excessive insulating material exists on the surface after the second opening OP2 is filled, the excessive insulating material may be removed and the surface may be flattened by a method such as CMP, etc. At this time, the insulating material of the surface is removed so that the portion of the second magnetic unit 300b that is provided on the second electrode 402 is exposed.

Figure 12A:
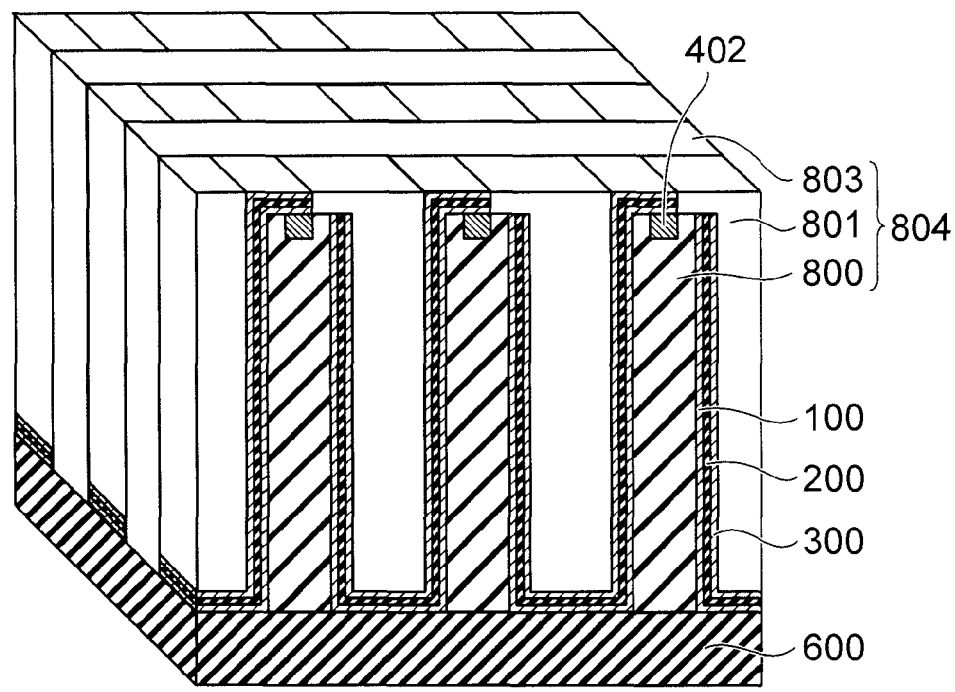

Then, as shown in FIG. 12A, a part of the portion of the first magnetic unit 100b formed on the insulating unit 800 is removed. By this process, the first magnetic unit 100 is formed by dividing the first magnetic unit 100b into a plurality in the X-direction. In other words, the portion of the first magnetic unit 100b that is formed on the upper surface of the insulating unit 800 is separated from the portion of the first magnetic unit 100b that is formed on one side surface of the insulating unit 800. Similarly, the insulating unit 200 and the second magnetic unit 300 are formed by dividing the insulating unit 200b and the second magnetic unit 300b into pluralities in the X-direction.

At this time, the first magnetic unit 100b is divided in the X-direction so that the second electrode 402 that is connected to one of the first magnetic units 100 does not contact one other of the first magnetic units 100 adjacent to the one of the first magnetic units 100 in the X-direction.

Figure 12B:
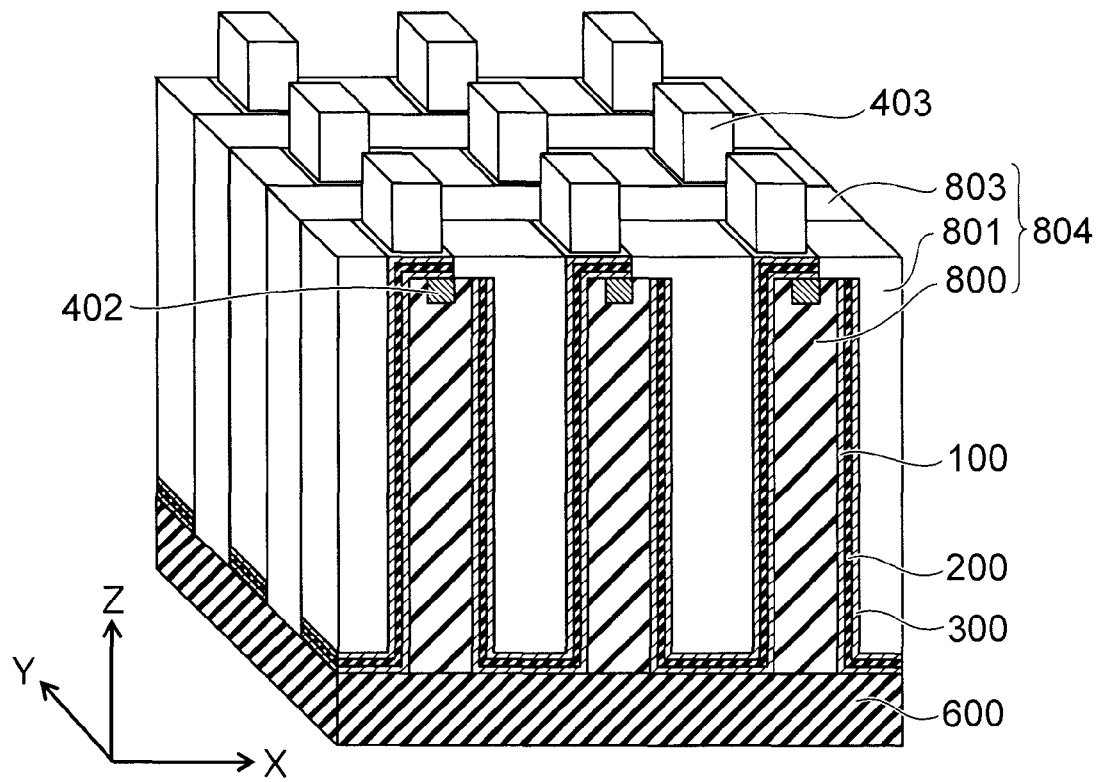

Then, a metal layer is formed on a second insulative structure body 804 made of the insulating units 800, 801, and 803. Then, as shown in FIG. 12B, the third electrode 403 is formed on the second magnetic unit 300 by patterning the metal layer. The third electrode 403 is formed on the second magnetic unit 300 exposed at the surface of the second insulative structure body 804.

In the example shown in FIG. 12B, the third electrode 403 is formed at a position opposing the second electrode 402 with the first magnetic unit 100, the insulating unit 200, and the second magnetic unit 300 interposed.

By the processes described above, the magnetic memory element 30 shown in FIG. 8 is obtained.

The process shown in FIG. 12A may be performed after the process shown in FIG. 12B.

In such a case, first, the metal layer is formed on the second insulative structure body 804 and on the second magnetic unit 300b.

Then, the third electrode 403 is formed by patterning the metal layer.

Subsequently, the first magnetic unit 100, the insulating unit 200, and the second magnetic unit 300 are formed by dividing the first magnetic unit 100b, the insulating unit 200b, and the second magnetic unit 300b into pluralities in the X-direction.

The process shown in FIG. 12A may be performed simultaneously with the process shown in FIG. 12B. In such a case, first, the metal layer is formed on the upper surface of the second insulative structure body 804 and the upper surface of the second magnetic unit 300b.

Then, the first magnetic unit 100b, the insulating unit 200b, and the second magnetic unit 300b are patterned simultaneously with patterning the metal layer to form the third electrode 403.

Thereby, the first magnetic unit 100, the insulating unit 200, and the second magnetic unit 300 that are separated from each other in the X-direction are formed.

According to the magnetic memory element according to the embodiment, it is possible to increase the memory capacity per unit surface area in the XY plane by the first magnetic unit 100 including the first extension portion 180 extending in the Z-direction.

Modification of Third Embodiment

A magnetic memory element 31 according to a modification of the third embodiment will now be described using FIG. 13.

Figure 13:
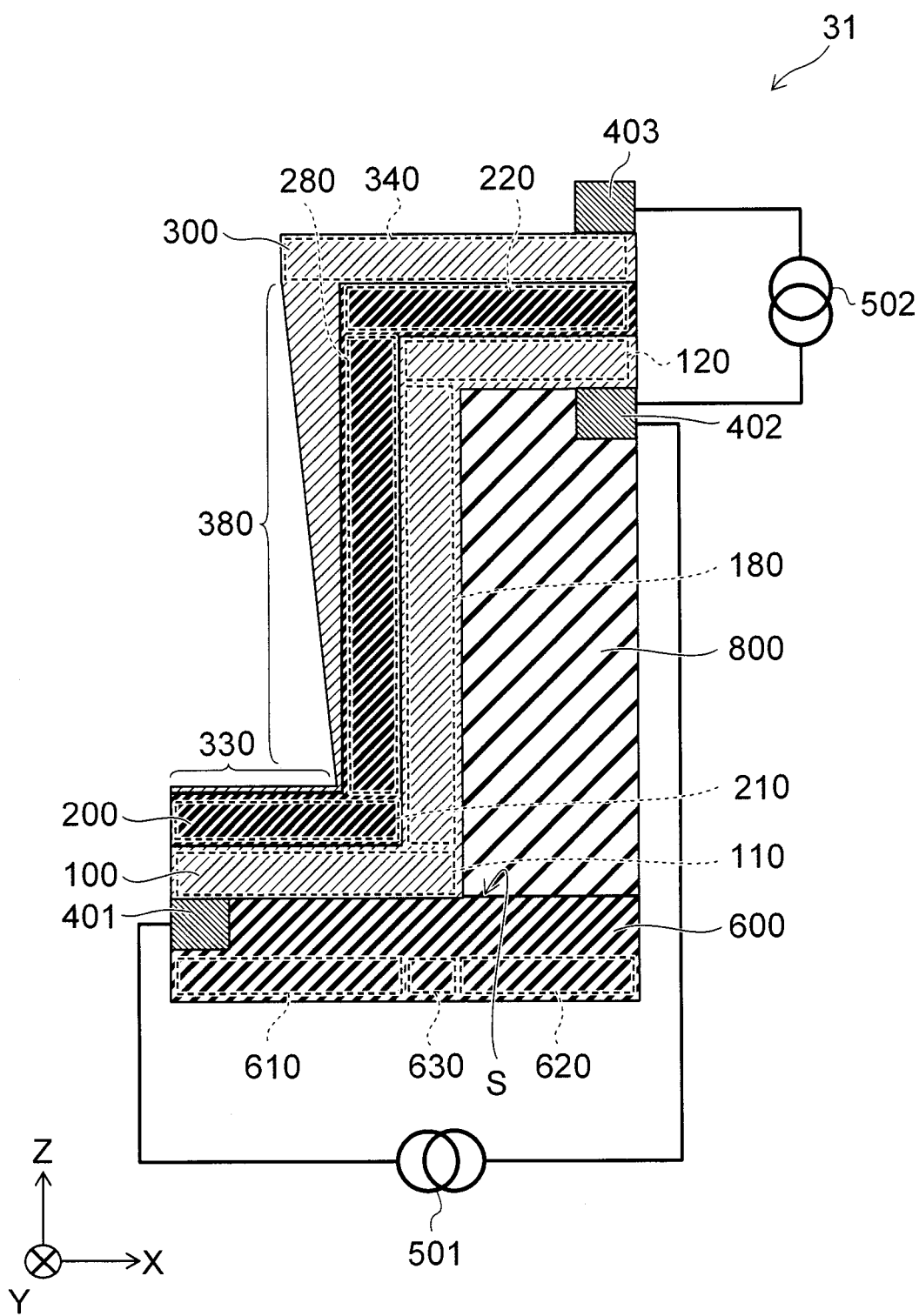
FIG. 13 is a schematic cross-sectional view showing the magnetic memory element 31 according to the modification of the third embodiment.

FIG. 13 is a schematic cross-sectional view showing the magnetic memory element 31 according to the modification of the third embodiment.

For example, the configuration of the magnetic memory element 31 other than the second magnetic unit 300 is the same as the configuration of the magnetic memory element 30.

The thickness in the Z-direction of the third portion 330 of the second magnetic unit 300 is thinner than the thickness in the Z-direction of the fourth portion 340 of the second magnetic unit 300. In other words, the thickness in the Z-direction of the third portion 330 of the second magnetic unit 300 overlapping at least a part of the first portion 110 in the Z-direction is thinner than the thickness in the Z-direction of the fourth portion 340 of the second magnetic unit 300 overlapping at least a part of the second portion 120 in the Z-direction.

The thickness in the X-direction of the third extension portion 380 gradually increases in the Z-direction. In other words, the thickness of the connection portion between the third portion 330 and the third extension portion 380 is thinner than the thickness of the connection portion between the fourth portion 340 and the third extension portion 380.

The film thickness of the third portion 330 of the second magnetic unit 300 may be zero. The second magnetic unit 300 may be such that the second magnetic unit 300 and the second portion 120 overlap in the Z-direction but the second magnetic unit 300 and the first portion 110 do not overlap in the Z-direction.

In such a case, the third extension portion 380 may be provided on only a part of the second extension portion 280. In other words, the film thickness of the third extension portion 380 may decrease gradually from the connection portion between the fourth portion 340 and the third extension portion 380 toward the −Z direction and may be zero at some point on the second extension portion 280 of the insulating unit 200.

A method for manufacturing the magnetic memory element 31 according to the modification of the third embodiment will now be described using FIGS. 14A and 14B.

Figure 14A:
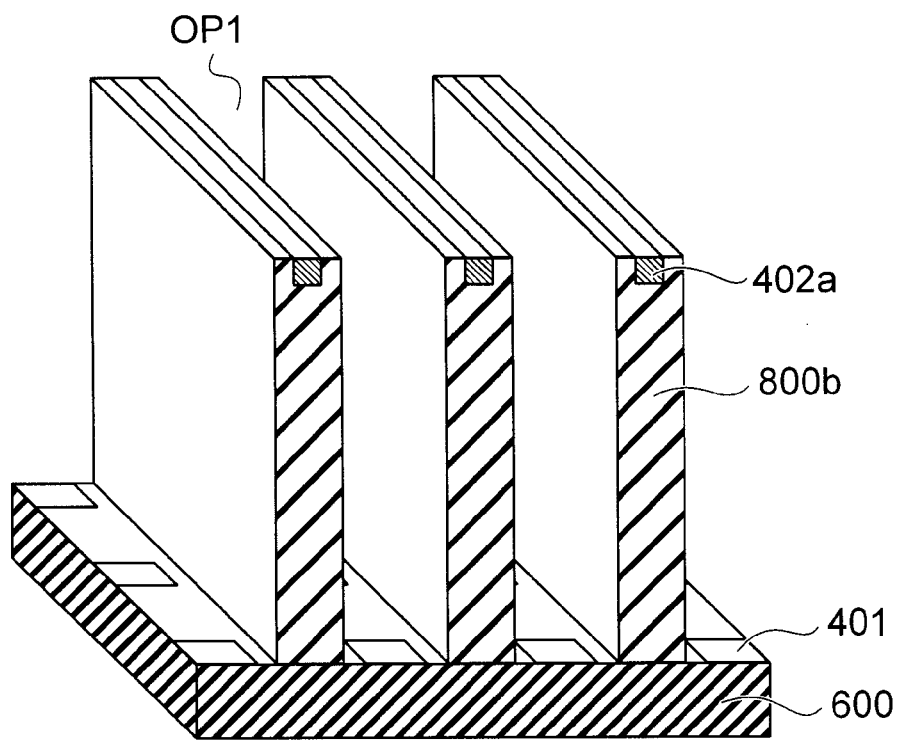
FIGS. 14A and 14B are views of processes, showing the manufacturing processes of the magnetic memory element 31 according to the modification of the third embodiment.
Figure 14B:
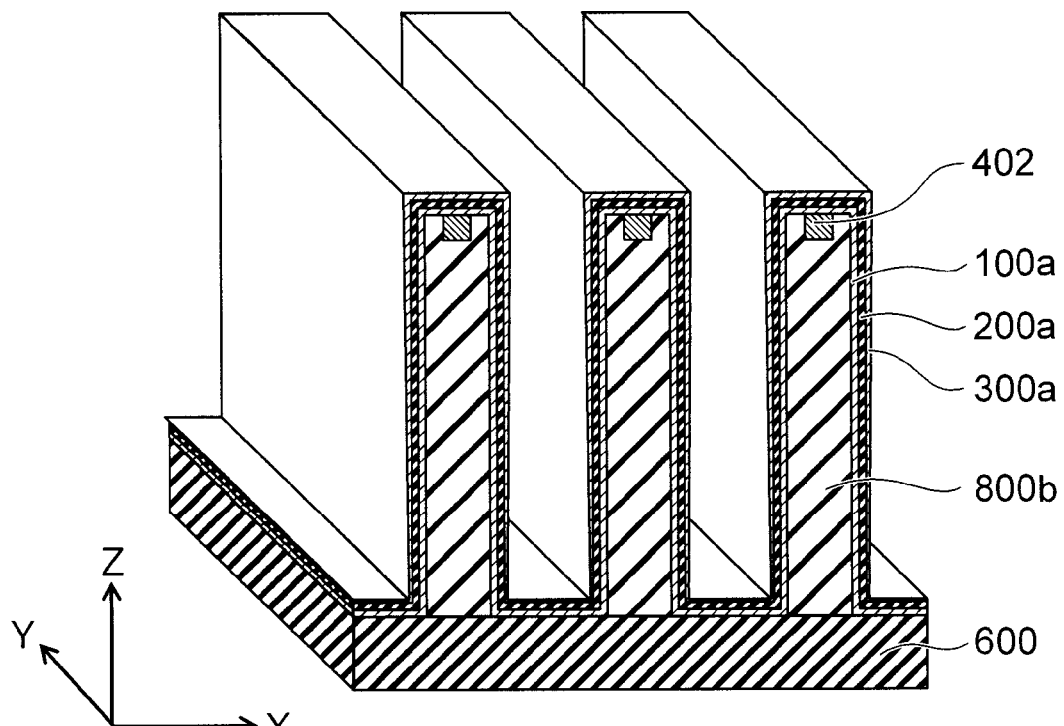

FIGS. 14A and 14B are views of processes, showing the manufacturing processes of the magnetic memory element 31 according to the modification of the third embodiment.

First, processes similar to the processes shown in FIGS. 9A to 9C are implemented; and the insulating unit 800b in which the opening OP1 is made is formed as shown in FIG. 14A.

Then, the first magnetic unit 100a is formed on the first electrode 401, on the insulating unit 800b, and on the second electrode 402a. Then, the insulating unit 200a is formed on the first magnetic unit 100a.

Subsequently, as shown in FIG. 14B, the second magnetic unit 300a is formed so that the thickness in the Z-direction of the portion overlapping at least a part of the first portion 110 in the Z-direction is thinner than the thickness in the Z-direction of the portion overlapping at least a part of the second portion 120 in the Z-direction. At this time, the thickness in the X-direction of the portion of the second magnetic unit 300a extending in the Z-direction decreases toward the −Z direction.

The second magnetic unit 300a may be formed so that the second magnetic unit 300a is not formed at a position overlapping at least a part of the first electrode 401 in the Z-direction.

For example, it is possible to form such a second magnetic unit 300a by performing sputtering using a target provided diagonally with respect to the depth direction of the opening OP1.

Subsequently, the magnetic memory element 31 is obtained by implementing processes similar to the processes shown in FIG. 10B, FIGS. 11A and 11B, and FIGS. 12A and 12B.

In the magnetic memory element 31 according to the modification, the thickness in the Z-direction of the third portion 330 is thinner than the thickness in the Z-direction of the fourth portion 340. The second magnetic unit 300 may be such that the second magnetic unit 300 and the second portion 120 overlap in the Z-direction but the second magnetic unit 300 and the first portion 110 do not overlap in the Z-direction.

By employing such a configuration, it is possible to increase the electrical resistance of the second magnetic unit 300 with respect to the current flowing between the first electrode 401 and the second electrode 402.

Therefore, it is possible to even further reduce the current flowing through the second magnetic unit 300 when shifting the domain walls of the first magnetic unit 100.

Fourth Embodiment

A magnetic memory element 40 according to a fourth embodiment will now be described using FIG. 15.

Figure 15:
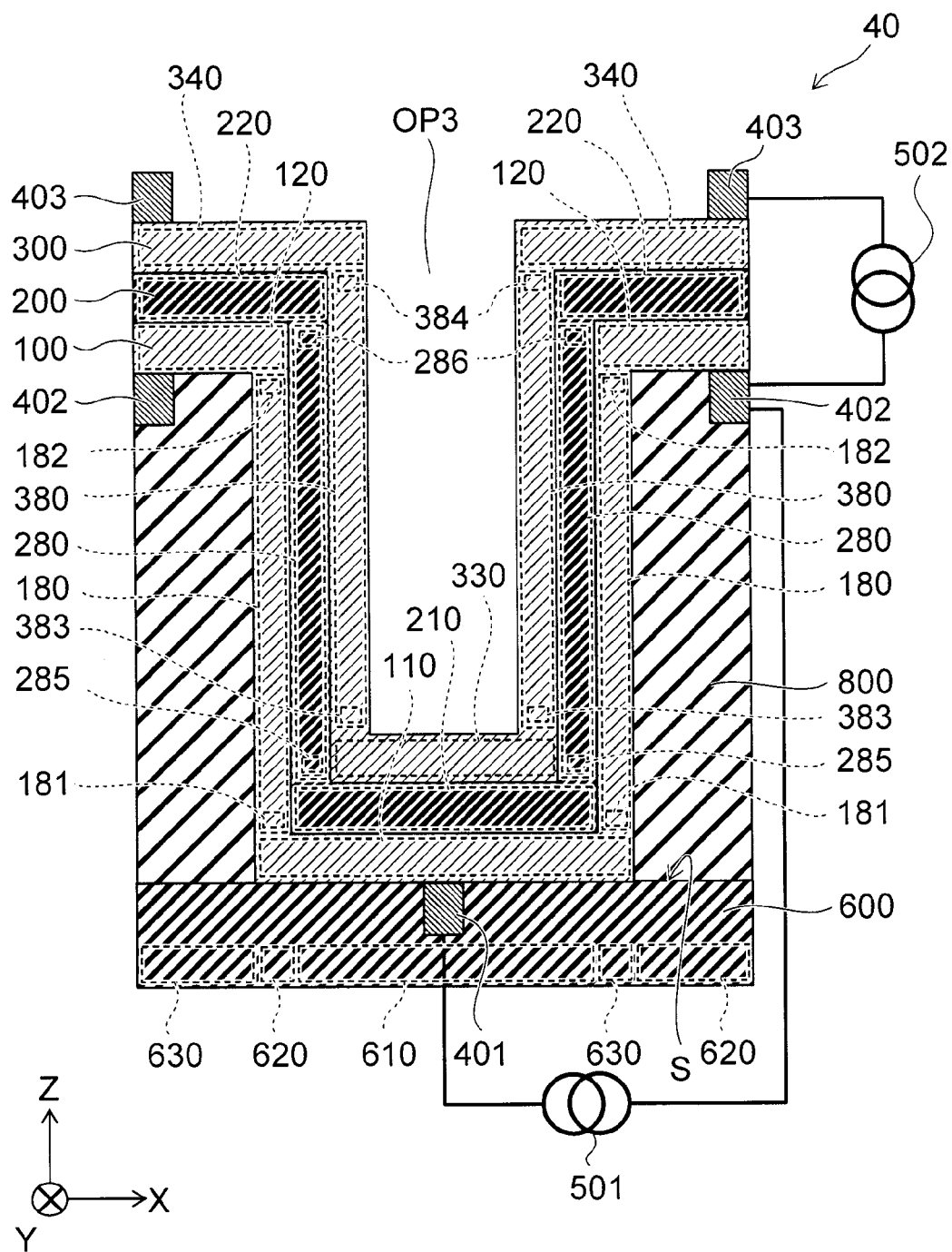
FIG. 15 is a schematic cross-sectional view showing the magnetic memory element 40 according to the fourth embodiment.

FIG. 15 is a schematic cross-sectional view showing the magnetic memory element 40 according to the fourth embodiment.

In the magnetic memory element 40 as shown in FIG. 15, similarly to the magnetic memory element 30, the first magnetic unit 100 includes the first portion 110, the second portion 120, and the first extension portion 180. The insulating unit 200 includes the first insulating portion 210, the second insulating portion 220, and the second extension portion 280. The second magnetic unit 300 includes the third portion 330, the fourth portion 340, and the third extension portion 380.

One section of the first magnetic unit 100, a part of the insulating unit 200, and a part of the second magnetic unit 300 are provided in pipe configurations inside an opening OP3 made in the insulating unit 800.

Therefore, the first extension portion 180 is provided around the second extension portion 280. The insulating unit 800 is provided around the first extension portion 180.

In such a case, the first extension portion 180 is provided between the second extension portion 280 and the insulating unit 800 when viewed in plan.

The first portion 110 is provided on the surface S of the substrate 600; and the second portion 120 is provided on the insulating unit 800.

When viewed in plan, the first extension portion 180 and a part of the second portion 120 overlap; and one other section of the second portion 120 is provided around the first extension portion 180.

The second electrode 402 is provided around at least a part of the first extension portion 180 in the Z-direction.

When viewed in plan, the third electrode 403 is provided around the first extension portion 180 and the second extension portion 280.

For example, the easy magnetization axes of the first portion 110, the second portion 120, and the first extension portion 180 of the first magnetic unit 100 are in a direction in the XY plane.

In the second portion 120 and the first extension portion 180, for example, the magnetic domains are formed in annular configurations. In such a case, in the second portion 120 and the first extension portion 180, the magnetization direction of one magnetic domain is in the direction from the second extension portion 280 toward the insulating unit 800 (the side wall of the opening OP3); and the magnetization direction of one other magnetic domain is the direction from the insulating unit 800 toward the second extension portion 280.

The second portion 120 may be provided only at a part around the first extension portion 180.

However, in the first magnetic unit 100, it is favorable for the second portion 120 to be provided in an annular configuration around the first extension portion 180 to move the magnetic domains more stably between the second portion 120 and the first extension portion 180.

In the case where the second portion 120 of the first magnetic unit 100 is provided in the annular configuration, it is favorable for the second insulating portion 220 and the fourth portion 340 to be similarly provided in annular configurations on the second portion 120 to protect the first magnetic unit 100.

In the magnetic memory element 40, the operations of moving the domain walls, reading the magnetic domains of the first magnetic unit 100, and writing the magnetic domains to the first magnetic unit 100 are similar to the operations of the magnetic memory element 10 according to the first embodiment.

A method for manufacturing the magnetic memory element 40 according to the fourth embodiment will now be described using FIG. 16A to FIG. 17B.

FIG. 16A to FIG. 17B are views of processes, showing the manufacturing processes of the magnetic memory element 40 according to the fourth embodiment.

Materials and formation methods similar to those of the method for manufacturing the magnetic memory element 30 according to the third embodiment are employable as the materials and formation methods of the components, and a description is therefore omitted as appropriate.

First, the multiple first electrodes 401 are formed in the X-direction and the Y-direction on the substrate 600 by implementing processes similar to the processes shown in FIG. 9A.

Figure 16A:
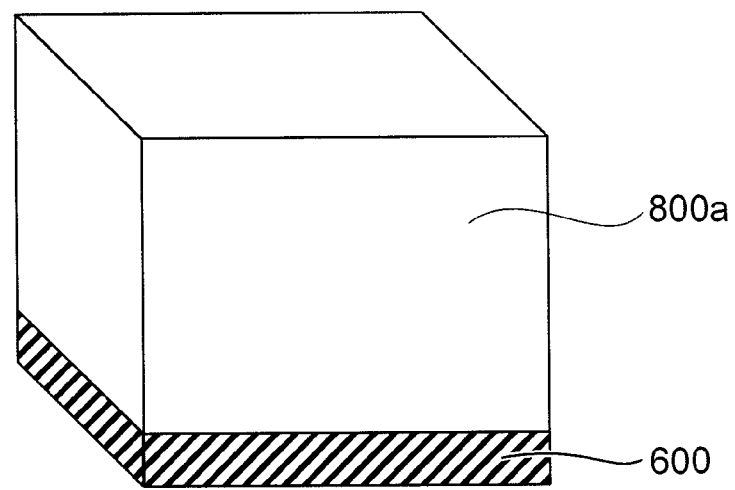
FIG. 16A to FIG. 17B are views of processes, showing the manufacturing processes of the magnetic memory element 40 according to the fourth embodiment.

Then, as shown in FIG. 16A, the insulating unit 800a is formed on the first electrodes 401.

Figure 16B:
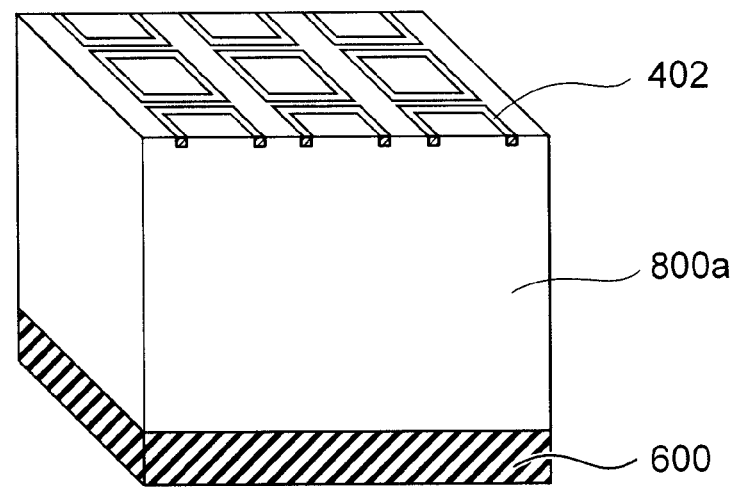

Continuing, openings are made in the surface of the insulating unit 800a. Then, the second electrodes 402 are formed in multiple annular configurations in the X-direction and the Y-direction as shown in FIG. 16B by forming a metal layer on the insulating unit 800a and by removing the excess metal material.

The second electrodes 402 may be formed by forming the metal layer on the surface of the insulating unit 800a and patterning the metal layer.

Figure 16C:
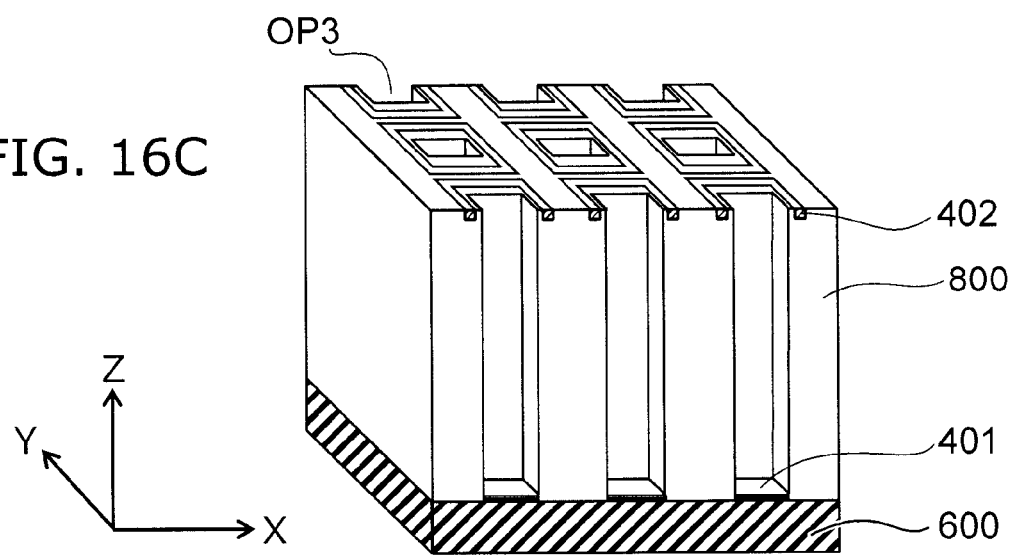

Then, as shown in FIG. 16C, the openings OP3 are made in the insulating unit 800a. The openings OP3 are made to expose the first electrodes 401. By this process, the insulating unit 800 that has the multiple openings OP3 is formed.

At this time, the second electrode 402 is provided around the first electrode 401 when viewed in plan.

For example, it is possible to employ various configurations such as a quadrilateral, a circle, etc., as the configuration of the opening OP3 when viewed in plan. The configuration of the second electrode 402 described above is determined to match the configuration of the opening OP3 when viewed in plan. In other words, in the case where the configuration of the opening OP3 when viewed in plan is a quadrilateral, the second electrode 402 is formed in an annular configuration having four corners.

For example, the openings OP3 are made by RIE using a resist mask that is periodically patterned in the X-direction and the Y-direction.

Then, the first magnetic unit 100a is formed on the first electrode 401, on the insulating unit 800, and on the second electrode 402.

Continuing, the insulating unit 200a is formed on at least a part of the first magnetic unit 100a; and the second magnetic unit 300a is formed on at least a part of the insulating unit 200a.

Figure 17A:
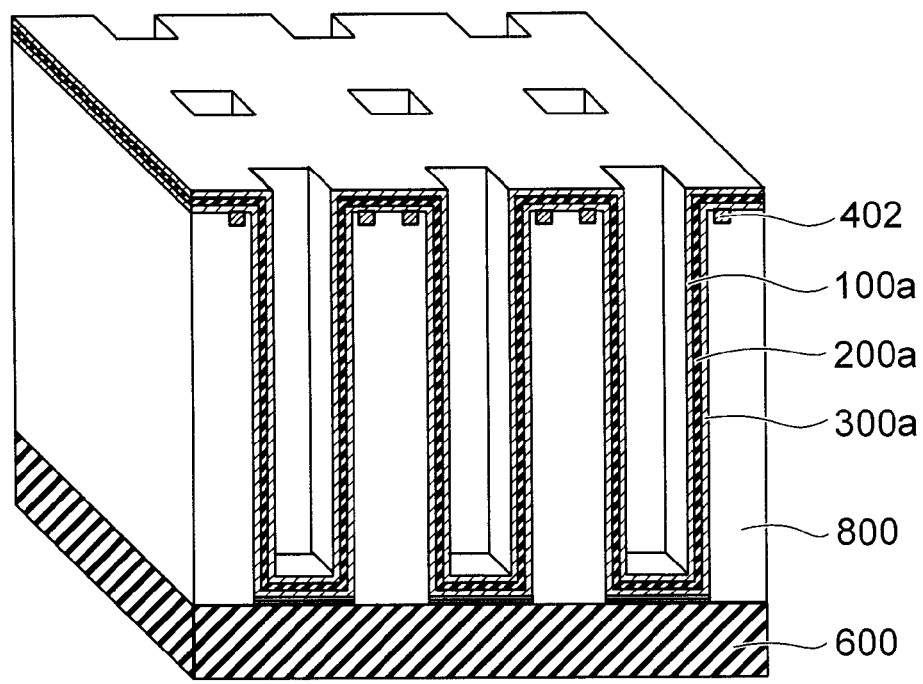

The state at this time is shown in FIG. 17A.

The film thickness of the first magnetic unit 100a, the film thickness of the insulating unit 200a, and the film thickness of the second magnetic unit 300a are thin compared to the width (the dimension in the X-direction and the Y-direction) and the depth (the dimension in the Z-direction) of the opening OP3. Therefore, the opening OP3 remains after forming the first magnetic unit 100a, the insulating unit 200a, and the second magnetic unit 300a.

Then, a metal layer is formed on the second magnetic unit 300a; and the third electrode 403 is formed by patterning the metal layer. For example, the third electrode 403 is patterned so that the third electrode 403 has a configuration similar to that of the second electrode 402.

Figure 17B:
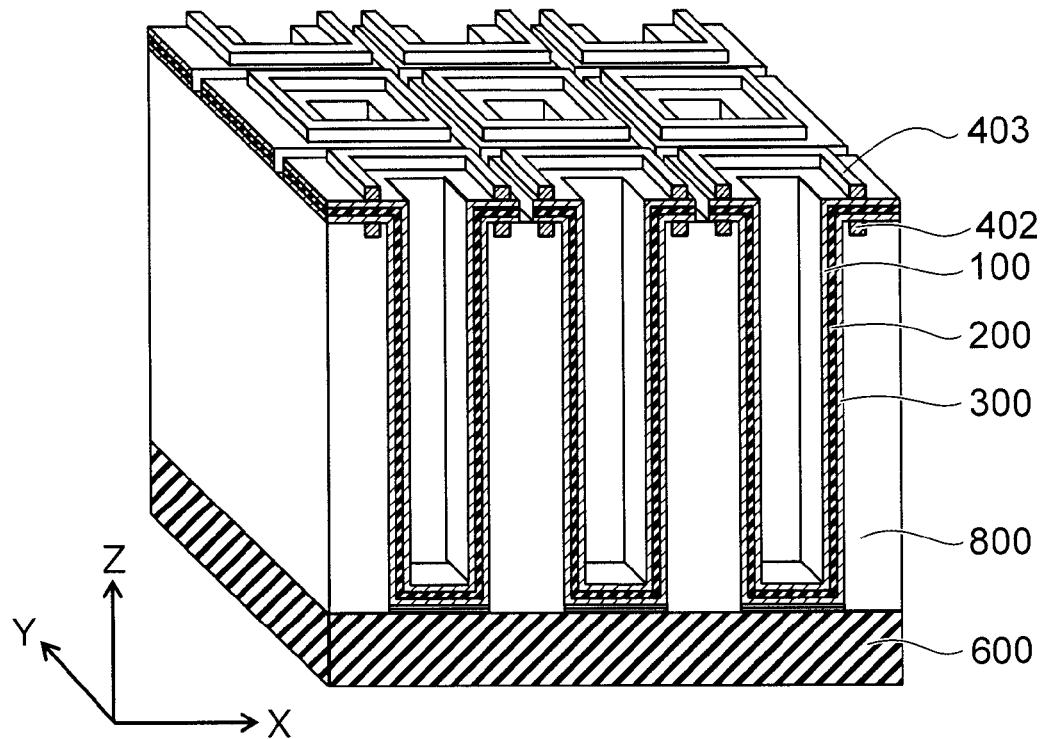

Continuing, the first magnetic unit 100 is formed by dividing the first magnetic unit 100a provided to be continuous on the insulating unit 800 into a plurality in the X-direction and the Y-direction as shown in FIG. 17B. At this time, the insulating unit 200 and the second magnetic unit 300 are formed by dividing the insulating unit 200a and the second magnetic unit 300a into pluralities in the X-direction and the Y-direction.

The insulating unit may be formed on the first magnetic unit 100a and the opening OP3 may be filled prior to forming the third electrode 403. In such a case, the second magnetic unit 300a is exposed by removing the excess insulating material that is on the surface; and the third electrode 403 is formed subsequently.

According to the magnetic memory element 40 according to the embodiment, similarly to the magnetic memory element 30 according to the third embodiment, it is possible to increase the memory capacity per unit surface area of the substrate 600 by the first magnetic unit 100 including the first extension portion 180 extending in the Z-direction.

By the easy magnetization axis of the first extension portion 180 of the first magnetic unit 100 of the magnetic memory element 40 according to the embodiment being a direction in the XY plane intersecting the Z-direction, the magnetic domains of the first extension portion 180 are formed in annular configurations; and it is possible to maintain the magnetic domains in the first extension portion 180 more stably.

According to the method for manufacturing the magnetic memory element 40 according to the embodiment, compared to the method for manufacturing the magnetic memory element 30 according to the third embodiment, it is possible to make the magnetic memory element more easily because the number of processes for patterning the insulating unit is low.

First Modification of Fourth Embodiment

A magnetic memory element 41 according to a first modification of the fourth embodiment will now be described using FIG. 18.

Figure 18:
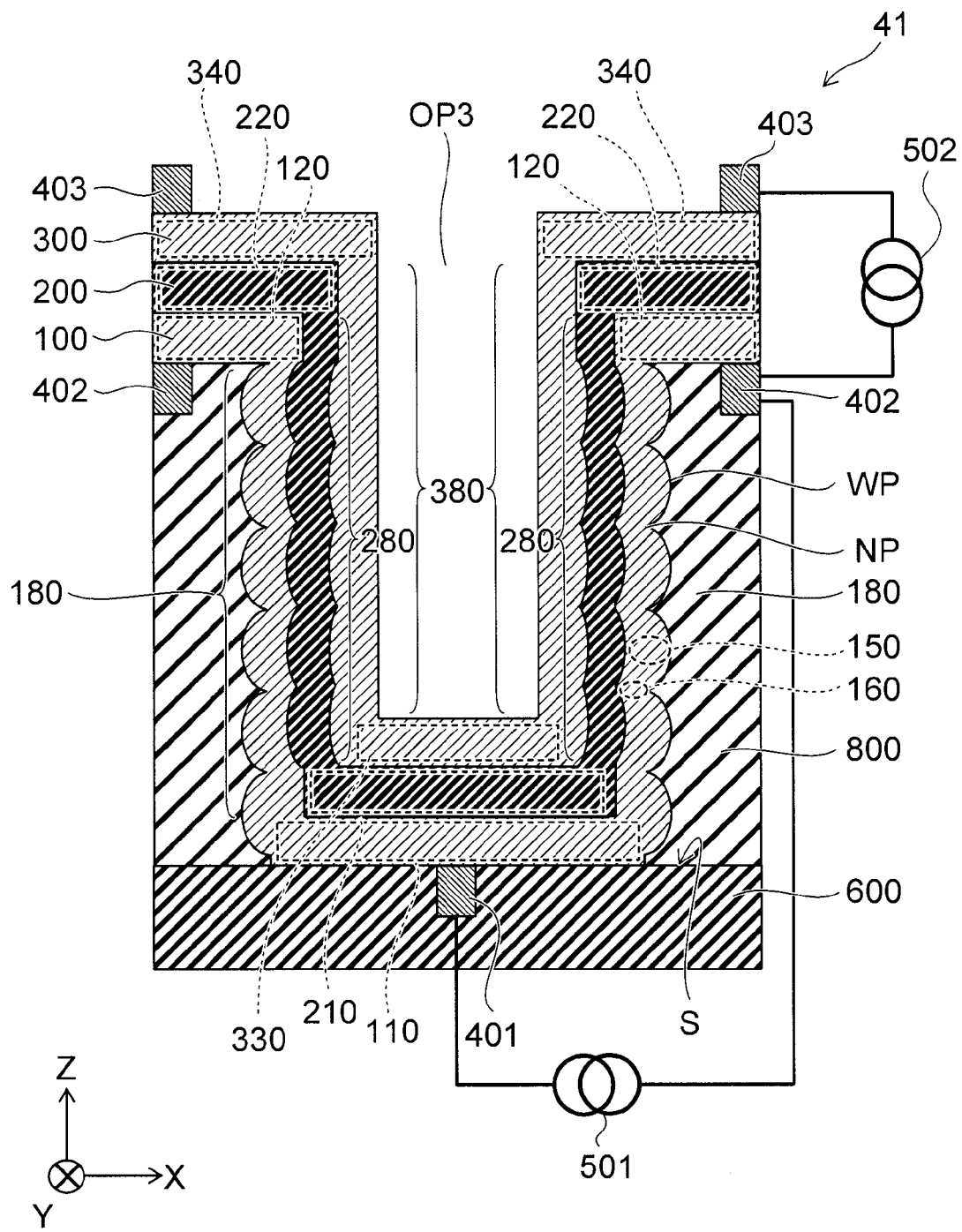
FIG. 18 is a schematic cross-sectional view showing the magnetic memory element 41 according to the first modification of the fourth embodiment.

FIG. 18 is a schematic cross-sectional view showing the magnetic memory element 41 according to the first modification of the fourth embodiment.

For example, the opening OP3 that is made in the insulating unit 800 of the magnetic memory element 41 is different from that of the magnetic memory element 40.

As shown in FIG. 18, the opening OP3 is made in the insulating unit 800. In the opening OP3, the insulating unit 800 includes portions provided periodically in the Z-direction where the dimension of the X-direction and the dimension of the Y-direction are small. In other words, in the opening OP3, the insulating unit 800 multiply includes seventh portions WP and eighth portions NP alternately, where the dimension in the X-direction of the seventh portion WP is a first value, and the dimension in the X-direction of the eighth portion NP is a second value that is less than the first value.

In the first magnetic unit 100, the first extension portion 180 includes multiple fifth portions 150 and multiple sixth portions 160. The fifth portions 150 and the sixth portions 160 are provided alternately in the Z-direction.

The fifth portion 150 is provided on the seventh portion WP; and the sixth portion 160 is provided on the eighth portion NP.

The distance from the X-direction end of the sixth portion 160 to the −X direction end of the sixth portion 160 is shorter than the distance from the X-direction end of the fifth portion 150 to the −X direction end of the fifth portion 150. The distance from the Y-direction end of the sixth portion 160 to the −Y direction end of the sixth portion 160 is shorter than the distance from the Y-direction end of the fifth portion 150 to the −Y direction end of the fifth portion 150.

The thickness of the fifth portion 150 in the direction from the second extension portion 280 toward the insulating unit 800 is thicker than the thickness of the sixth portion 160 in the direction from the second extension portion 280 toward the insulating unit 800.

A method for manufacturing the magnetic memory element 41 according to the first modification of the fourth embodiment will now be described using FIGS. 19A and 19B.

Figure 19A:
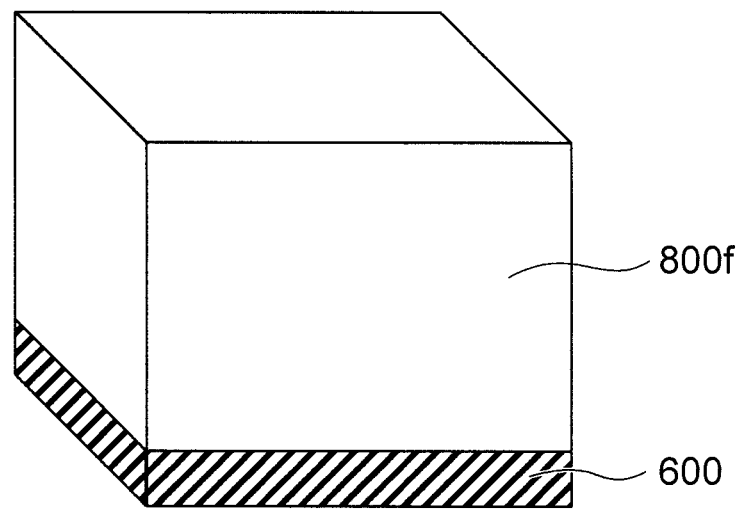
FIGS. 19A and 19B are views of processes, showing the manufacturing processes of the magnetic memory element 41 according to the first modification of the fourth embodiment.
Figure 19B:
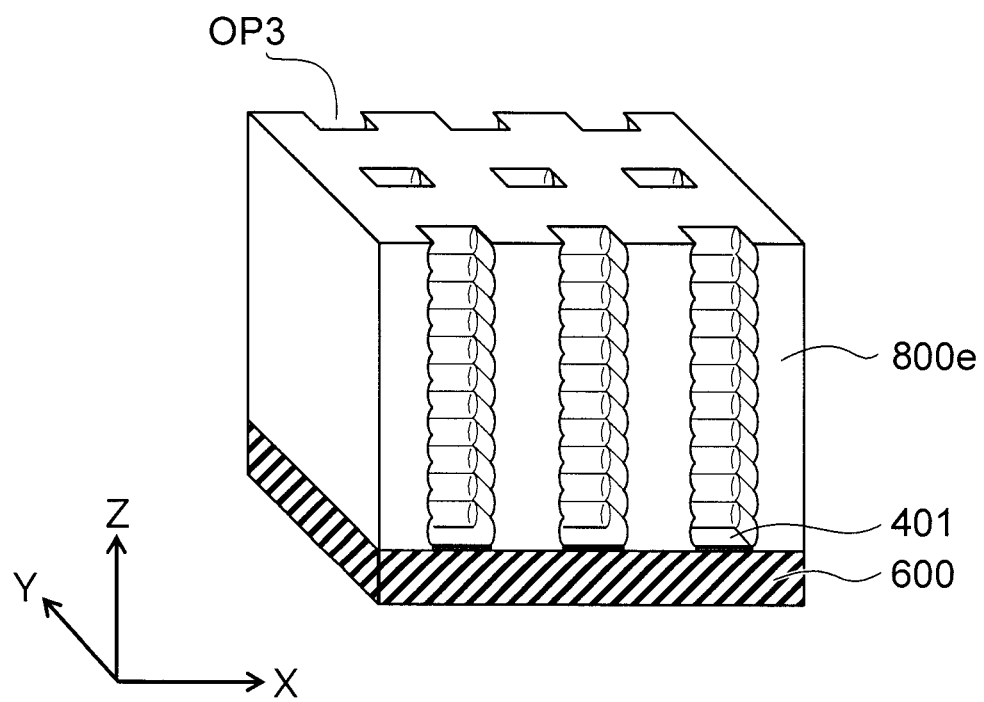

FIGS. 19A and 19B are views of processes, showing the manufacturing processes of the magnetic memory element 41 according to the first modification of the fourth embodiment.

First, as shown in FIG. 19A, a base member 800f on which anodic oxidation is to be performed is formed on the substrate 600 in which the first electrode 401 is formed. Al, Si, etc., may be used as the material of the base member 800f.

Then, as shown in FIG. 19B, the opening OP3 is made in the base member 800f using anodic oxidation.

When a current is provided inside an electrolyte solution (sulfuric acid, oxalic acid, phosphoric acid, etc.) using the base member 800f as an anode, the anode metal is oxidized and dissolved into metal ions. The metal ions bond with the oxygen of the water to form a metal oxide that remains and grows on the anode metal surface.

For example, in the case where Al is used as the material of the base member 800f, $Al_2O_3$ grows on the base member 800f. In such a case, a fine opening OP3 is made in the $Al_2O_3$ at the Al surface of the anode by the simultaneous progress of dissolving and growing. The dimension of the opening OP3 is determined by the Al purity, the voltage, the electrolyte solution, and the processing time.

It is possible to make the opening OP3 including the pinched-in portions periodically in the Z-direction by periodically changing the voltage that is applied when performing the anodic oxidation.

While a high voltage is applied, the portion having the small dimension in the X-direction and the Y-direction is formed because the anodic oxidation progresses quickly in the depth direction. Therefore, the dimension of the portion where the high voltage is applied is relatively small; and the dimension of the portion where the low voltage is applied is relatively large.

For example, in the case where the processing of the anodic oxidation is performed for 225 minutes by alternately applying voltages of 25 V and 30 V at 35° C. using sulfuric acid for an Al base member having a purity of 99.995% or more, the opening OP3 having a pitch of 60 nm and a depth of 15 μm is made. The diameter of the opening OP3 that is made at this time changes periodically in the Z-direction and has an average value of 20 nm.

Here, the pitch means the sum of the diameter of the opening OP3 and the distance between mutually-adjacent openings OP3.

In the case where anodic oxidation is used, an insulating portion is formed at the bottom of the base member 800f. It is difficult to remove the insulating portion by anodic oxidation. Therefore, to expose the first electrode 401, it is favorable to remove the insulating portion using phosphoric acid, etc.

By the processes described above, the insulating unit 800 that has the opening OP3 is formed.

Subsequently, the second electrode 402 is formed on the insulating unit 800; and the magnetic memory element 41 is obtained by implementing processes similar to the processes shown in FIGS. 17A and 17B.

For example, in the case where Si is used as the base member 800f, it is possible to use hydrofluoric acid as the electrolyte solution. In such a case, the insulating unit 800 that is obtained includes $SiO_2$ having the opening OP3 having a diameter of several hundred nm.

In the magnetic memory element 41 according to the embodiment, the first extension portion 180 that extends in the Z-direction includes the fifth portion 150 and the sixth portion 160; and the distance from the X-direction end of the sixth portion 160 to the −X direction end of the sixth portion 160 is shorter than the distance from the X-direction end of the fifth portion 150 to the −X direction end of the fifth portion 150.

The outer circumference of the portion is small where the distance from the X-direction end to the −X direction end is short. The domain walls can exist with a lower energy at the portions having small outer circumferences than at the portions having large outer circumferences. Therefore, the domain walls can stop stably at the portions having short distances even in the case where there is fluctuation in the shift amount of the domain walls. Because the domain walls stop stably, it is possible to reduce the occurrence of shift errors of the domain walls because the regions where the magnetic domains are maintained are stable.

Second Modification of Fourth Embodiment

A magnetic memory element 42 according to a second modification of the fourth embodiment will now be described using FIG. 20.

Figure 20:
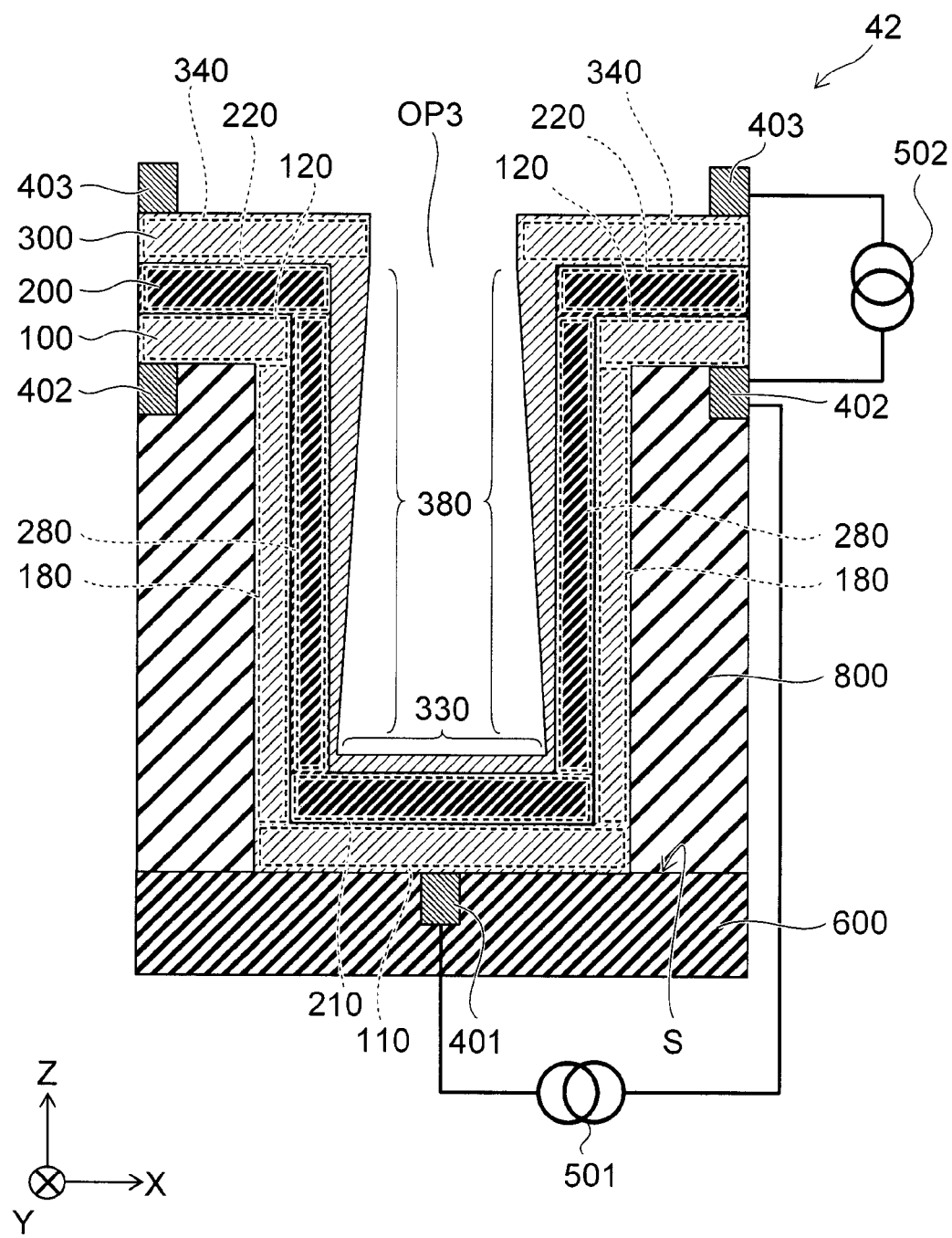
FIG. 20 is a schematic cross-sectional view showing the magnetic memory element 42 according to the second modification of the fourth embodiment.

FIG. 20 is a schematic cross-sectional view showing the magnetic memory element 42 according to the second modification of the fourth embodiment.

For example, the configuration of the magnetic memory element 42 other than the second magnetic unit 300 is the same as the configuration of the magnetic memory element 40.

The thickness in the Z-direction of the third portion 330 of the second magnetic unit 300 is thinner than the thickness in the Z-direction of the fourth portion 340 of the second magnetic unit 300. In other words, the thickness in the Z-direction of the third portion of the second magnetic unit 300 is thinner than the thickness in the Z-direction of the fourth portion of the second magnetic unit 300, where the third portion and at least a part of the first portion 110 overlap in the Z-direction, and the fourth portion and at least a part of the second portion 120 overlap in the Z-direction.

The thickness in the X-direction of the third extension portion 380 gradually increases in the Z-direction. In other words, the thickness of the connection portion between the third portion 330 and the third extension portion 380 is thinner than the thickness of the connection portion between the fourth portion 340 and the third extension portion 380.

The film thickness of the third portion 330 of the second magnetic unit 300 may be zero. The second magnetic unit 300 may be such that the second magnetic unit 300 and the second portion 120 overlap in the Z-direction but the second magnetic unit 300 and the first portion 110 do not overlap in the Z-direction.

A method for manufacturing the magnetic memory element 42 according to the second modification of the fourth embodiment will now be described using FIGS. 21A and 21B.

Figure 21A:
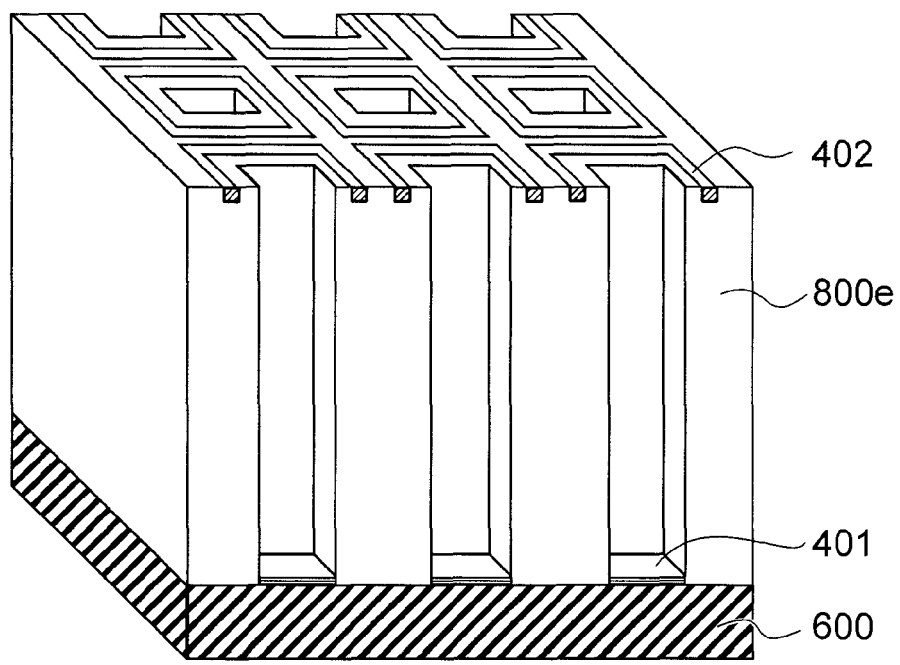
FIGS. 21A and 21B are views of processes, showing the manufacturing processes of the magnetic memory element 42 according to the second modification of the fourth embodiment.
Figure 21B:
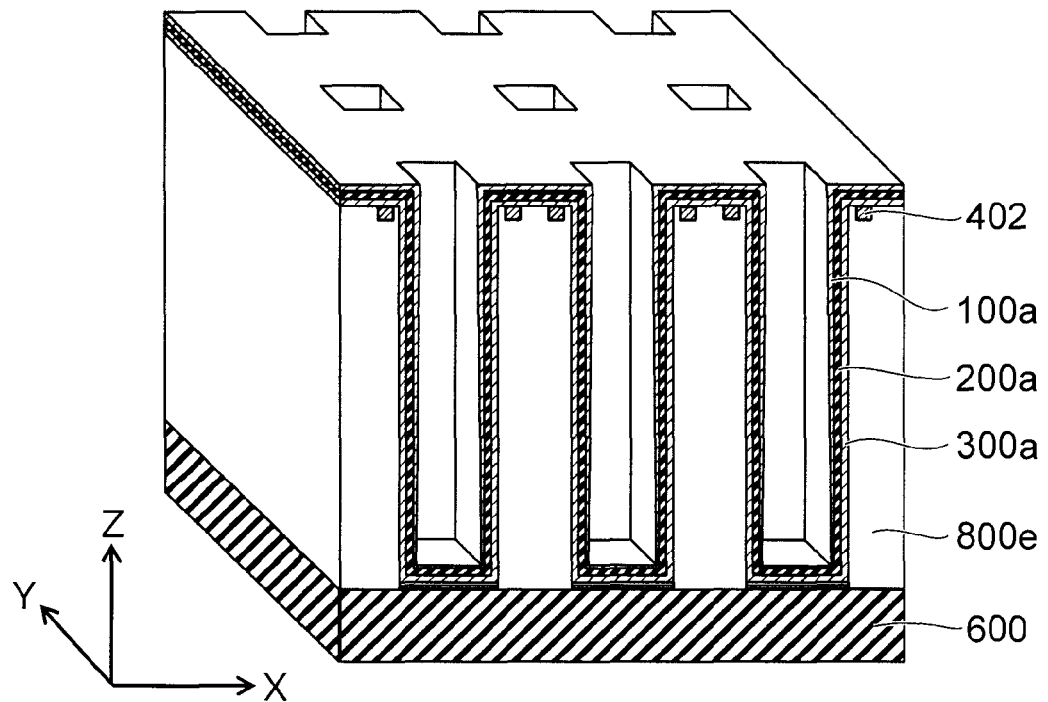

FIGS. 21A and 21B are views of processes, showing the manufacturing processes of the magnetic memory element 42 according to the second modification of the fourth embodiment.

First, processes similar to the processes shown in FIGS. 16A to 16C are implemented; and the insulating unit 800 in which the opening OP3 is made is formed as shown in FIG. 21A.

Then, the first magnetic unit 100a is formed on the first electrode 401, on the insulating unit 800, and on the second electrode 402. Continuing, the insulating unit 200a is formed on the first magnetic unit 100a.

Subsequently, the second magnetic unit 300a is formed so that the thickness in the Z-direction of the portion of the second magnetic unit 300a overlapping at least a part of the first portion 110 in the Z-direction is thinner than the thickness in the Z-direction of the portion of the second magnetic unit 300a overlapping at least a part of the second portion 120 in the Z-direction.

The second magnetic unit 300a may be formed so that the second magnetic unit 300a is not formed at a position overlapping the first electrode 401 in the Z-direction.

Finally, the magnetic memory element 42 is obtained by implementing a process similar to the process shown in FIG. 17B.

According to the magnetic memory element 42 according to the modification, the electrical resistance of the second magnetic unit 300 can be increased similarly to the magnetic memory element 31 according to the modification of the third embodiment.

Therefore, it is possible to even further reduce the current flowing through the second magnetic unit 300 when shifting the domain walls of the first magnetic unit 100.

According to the method for manufacturing the magnetic memory element 42 according to the modification, it is possible to control the configuration of the first region 301 and the second region 302 more easily because the second magnetic unit 300 is formed using sputtering.

Fifth Embodiment

A magnetic memory 50 according to a fifth embodiment will now be described using FIG. 22.

Figure 22:
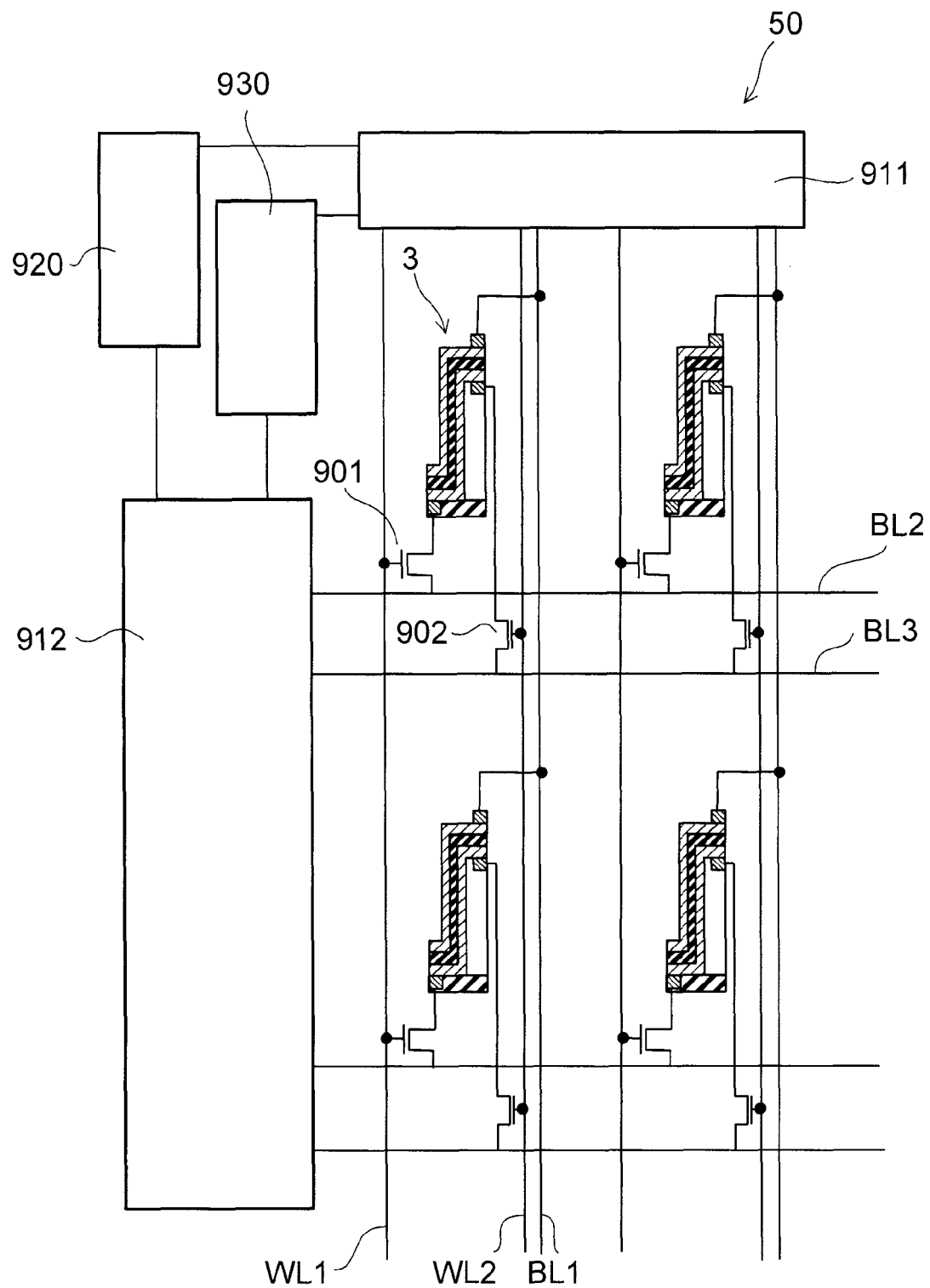
FIG. 22 is a schematic view showing the magnetic memory 50 according to the fifth embodiment.

FIG. 22 is a schematic view showing the magnetic memory 50 according to the fifth embodiment.

The magnetic memory 50 according to the fifth embodiment multiply includes the magnetic memory elements according to the embodiments described above and is included in, for example, shift register memory. For example, as shown in FIG. 22, the magnetic memory 50 multiply includes the magnetic memory element 30 according to the third embodiment.

The magnetic memory 50 includes the magnetic memory element 10, a first transistor 901, a second transistor 902, a first selector 911, a second selector 912, a current source circuit 920, and a resistance value sensor 930.

The first selector 911 is connected to a first bit line BL1, a first word line WL1, and a second word line WL2.

The second selector 912 is connected to a second bit line BL2 and a third bit line BL3.

The third electrode 403 is connected to the first bit line BL1.

The gate of the first transistor 901 is connected to the first word line WL1. A first terminal of the first transistor 901 is connected to the first electrode 401; and a second terminal of the first transistor 901 is connected to the second bit line BL2.

The gate of the second transistor 902 is connected to the second word line WL2. A first terminal of the second transistor 902 is connected to the second electrode 402; and a second terminal of the second transistor 902 is connected to the third bit line BL3.

The current source circuit 920 that functions as the first current source 501 and the second current source 502 is connected to the first selector 911 and the second selector 912.

The resistance value sensor 930 is connected to the first selector 911 and the second selector 912. The resistance value sensor 930 is capable of sensing the change of the resistance value between the second bit line BL2 connected to the first electrode 401, the third bit line BL3 connected to the second electrode 402, and the first bit line BL1 connected to the third electrode 403.

For example, it is possible to sense the change of the resistance value by the current source circuit 920 causing a constant current to flow between the first electrode 401, the second electrode 402, and the third electrode 403 and by the resistance value sensor 930 sensing the change of the voltage between the first electrode 401, the second electrode 402, and the third electrode 403.

It is possible to sense the change of the resistance value by the current source circuit 920 applying a constant voltage between the first electrode 401, the second electrode 402, and the third electrode 403 and by the resistance value sensor 930 sensing the change of the current flowing between the first electrode 401, the second electrode 402, and the third electrode 403.

It is possible to increase the magnetic recording density of the magnetic memory by the magnetic memory including the magnetic memory element according to the embodiment.

Clause 1

A method for operating a magnetic memory element, the magnetic memory element including:
a first magnetic unit including multiple magnetic domains arranged in a direction in which the first magnetic unit extends, the first magnetic unit including a first portion and a second portion;
a second magnetic unit including a first region and a second region, the first region including a conductive material, the second region including an insulating material, at least one of the first region or the second region being magnetic;
a first insulating unit provided between the first magnetic unit and the second magnetic unit;
a first electrode connected to the first portion;
a second electrode connected to the second portion; and
a third electrode, a part of the second magnetic unit and a part of the first insulating unit being provided between the third electrode and a part of the first magnetic unit,
the method comprising:
moving the multiple magnetic domains by causing a current to flow between the first electrode and the second electrode.

Clause 2

The method for operating the magnetic memory element according to Clause 1, including controlling a magnetization direction of at least one magnetic domain of the multiple magnetic domains by causing a current to flow between the second electrode and the third electrode after moving the multiple magnetic domains.

Clause 3

The method for operating the magnetic memory element according to Clause 1, including sensing a magnetization direction of at least one magnetic domain of the multiple magnetic domains by causing a current to flow between the second electrode and the third electrode after moving the multiple magnetic domains.

Clause 4

A method for operating a magnetic memory element, the magnetic memory element including:
a first magnetic unit including multiple magnetic domains arranged in a direction in which the first magnetic unit extends, the first magnetic unit including a first portion and a second portion;
a second magnetic unit including a first region and a second region, the first region including a conductive material, the second region including an insulating material, at least one of the first region or the second region being magnetic;
a first insulating unit provided between the first magnetic unit and the second magnetic unit;
a first electrode connected to the first portion;
a second electrode connected to the second portion;
a third electrode, a part of the second magnetic unit and a part of the first insulating unit being provided between the third electrode and a part of the first magnetic unit,
the method comprising:
controlling a magnetization direction of at least one magnetic domain of the multiple magnetic domains by causing the current to flow between the second electrode and the third electrode.

Clause 5

The method for operating the magnetic memory element according to Clause 4, including moving the multiple magnetic domains by causing a current to flow between the first electrode and the second electrode after controlling the magnetization direction of the at least one magnetic domain of the multiple magnetic domains.

Clause 6

A method for operating a magnetic memory element, the magnetic memory element including:
a first magnetic unit including multiple magnetic domains arranged in a direction in which the first magnetic unit extends, the first magnetic unit including a first portion and a second portion;
a second magnetic unit including a first region and a second region, the first region including a conductive material, the second region including an insulating material, at least one of the first region or the second region being magnetic;
a first insulating unit provided between the first magnetic unit and the second magnetic unit;
a first electrode connected to the first portion;
a second electrode connected to the second portion; and
a third electrode, a part of the second magnetic unit and a part of the first insulating unit being provided between the third electrode and a part of the first magnetic unit,
the method comprising:
sensing a magnetization direction of at least one magnetic domain of the multiple magnetic domains by causing a current to flow between the second electrode and the third electrode.

Clause 7

The method for operating the magnetic memory element according to Clause 6, including moving the multiple magnetic domains by causing a current to flow between the first electrode and the second electrode after sensing the magnetization direction of the at least one magnetic domain of the multiple magnetic domains.

Clause 8

A method for manufacturing a magnetic memory element, comprising:

forming a first magnetic unit on a substrate;

forming an insulating unit on at least a part of the first magnetic unit;

forming a second magnetic unit on at least a part of the insulating unit, the second magnetic unit including a first region and a second region, the first region including a conductive material, the second region including an insulating material;

forming a metal layer on the second magnetic unit; and forming a first electrode on a part of the second magnetic unit by patterning the metal layer.

Clause 9

The method for manufacturing the magnetic memory element according to Clause 8, including forming the first magnetic unit on the second electrode and on the third electrode after forming the second electrode and the third electrode on the substrate.

Clause 10

The method for manufacturing the magnetic memory element according to Clause 8 or 9, including forming one of the first region or the second region using a magnetic material and forming the other of the first region or the second region using a nonmagnetic material.

Clause 11

The method for manufacturing the magnetic memory element according to Clause 9, including forming the first electrode by patterning the metal layer to cause a part of the first magnetic unit, a part of the insulating unit, and a part of the second magnetic unit to be positioned between the first electrode and the second electrode.

Clause 12

A method for manufacturing a magnetic memory element, comprising:

forming multiple first electrodes on a substrate;

forming a first insulating unit on the multiple first electrodes;

forming multiple second electrodes on the first insulating unit;

exposing the multiple first electrodes by making a first opening in a region of the first insulating unit where the second electrode is not provided, the first opening extending in a first direction parallel to a surface of the substrate;

forming a first magnetic unit on the multiple first electrodes, on the first insulating unit, and on the multiple second electrodes;

forming a second insulating unit on at least a part of the first magnetic unit;

forming a second magnetic unit on at least a part of the second insulating unit, the second magnetic unit including a first region and a second region, the first region including a conductive material, the second region including an insulating material;

filling the first opening by forming a third insulating unit after forming the second magnetic unit;

dividing the first magnetic unit and the second magnetic unit into pluralities in the first direction by making a second opening in the first insulating unit and the third insulating unit, the second opening extending in a second direction, the second direction intersecting the first direction and being parallel to the surface of the substrate;

filling the second opening by forming a fourth insulating unit;

dividing, into pluralities in the second direction, the first magnetic unit and the second magnetic unit divided into the pluralities in the first direction; and forming a third electrode on each of the second magnetic units divided into the plurality in the second direction.

Clause 13

A method for manufacturing a magnetic memory element, comprising:

forming multiple first electrodes on a substrate;

forming a first insulating unit on the multiple first electrodes;

forming multiple second electrodes on the first insulating unit;

exposing the multiple first electrodes by making multiple openings in the first insulating unit in a first direction and a second direction, the first direction being parallel to a surface of the substrate, the second direction intersecting the first direction;

forming a first magnetic unit on the multiple first electrodes, on the insulating unit, and on the multiple second electrodes;

forming a second insulating unit on at least a part of the first magnetic unit;

forming a second magnetic unit on at least a part of the second insulating unit, the second magnetic unit including a first region and a second region, the first region including a conductive material, the second region including an insulating material;

filling the openings by forming a third insulating unit on the second magnetic unit;

dividing the first magnetic unit and the second magnetic unit into pluralities in the first direction and the second direction; and forming a third electrode on each of the multiple second magnetic units.

Clause 14

A method for manufacturing a magnetic memory element, comprising:

forming multiple first electrodes on a substrate;

forming a base member on the multiple first electrodes;

exposing the multiple first electrodes by using anodic oxidation to change the base member into a first insulating unit while making multiple openings in the base member in a first direction and a second direction, the first direction being parallel to a surface of the substrate, the second direction intersecting the first direction and being parallel to the surface of the substrate;

forming multiple second electrodes on the first insulating unit;

forming a first magnetic unit on the multiple first electrodes, on the insulating unit, and on the multiple second electrodes;

forming a second insulating unit on at least a part of the first magnetic unit;

forming a second magnetic unit on at least a part of the second insulating unit, the second magnetic unit including a first region and a second region, the first region including a conductive material, the second region including an insulating material;

filling the openings by forming a third insulating unit on the second magnetic unit;

dividing the first magnetic unit and the second magnetic unit into pluralities in the first direction and the second direction; and forming a third electrode on each of the multiple second magnetic units.

Clause 15

The method for manufacturing the magnetic memory element according to Clause 14, wherein the exposing of the multiple first electrodes includes alternately applying a first voltage and a second voltage to the base member when performing the anodic oxidation, the second voltage being higher than the first voltage.

Clause 16

The method for manufacturing the magnetic memory element according to one of Clauses 13 to 15, wherein the exposing of the multiple first electrodes includes making the openings to cause the openings to multiply include, alternately in a third direction, a portion having a dimension in the first direction equal to a first value and a portion having a dimension in the first direction equal to a second value, the second value being smaller than the first value, the third direction being orthogonal to the first direction and the second direction.

Clause 17

The method for manufacturing the magnetic memory element according to one of Clauses 13 to 16, wherein the forming of the second electrodes includes forming the second electrodes around the openings.

Clause 18

The method for manufacturing the magnetic memory element according to one of Clauses 12 to 17, wherein the forming of the second magnetic unit includes forming one of the first region or the second region using a magnetic material and forming the other of the first region or the second region using a nonmagnetic material.

Clause 19

The method for manufacturing the magnetic memory element according to one of Clauses 12 to 18, wherein the forming of the third electrode includes forming the third electrode to cause a part of the first magnetic unit, a part of the insulating unit, and a part of the second magnetic unit to be positioned between the second electrode and the third electrode.

Clause 20

The method for manufacturing the magnetic memory element according to one of Clauses 12 to 19, wherein the forming of the second magnetic unit includes forming the second magnetic unit to cause a film thickness of a portion of the second magnetic unit positioned on the first electrode to be thinner than a film thickness of a portion of the second magnetic unit positioned on the second electrode.

Clause 21

The method for manufacturing the magnetic memory element according to one of Clauses 12 to 20, wherein the forming of the second magnetic unit includes forming the second magnetic unit at a position to cause the second magnetic unit and the second electrode to overlap in a third direction orthogonal to the first direction and the second direction, the second magnetic unit not being formed at a position causing the second magnetic unit and at least a part of the first electrode to overlap in the third direction.

Clause 22

The method for manufacturing the magnetic memory element according to one of Clauses 12 to 21, wherein the forming of the second magnetic unit includes forming the second magnetic unit to have an easy magnetization axis in an in-plane direction.

According to the embodiments, a magnetic memory element and a magnetic memory in which it is possible to reduce the power consumption can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory element and the magnetic memory such as the magnetic unit, the insulating unit, the electrode, the current source, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memory elements and all magnetic memories practicable by an appropriate design modification by one skilled in the art based on the magnetic memory elements and the magnetic memories described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element, comprising:
   a first electrode;
   a second electrode;
   a third electrode;
   a first magnetic layer including a first partial region and a second partial region, the first partial region being provided between the second electrode and the third electrode in a first direction, the second partial region being electrically connected with the first electrode;
   a first insulating layer including a third partial region and a fourth partial region, the third partial region being provided between the first partial region and the third electrode in the first direction, a part of the second partial region being provided between a part of the fourth partial region and the second electrode in a second direction crossing the first direction; and
   a second magnetic layer including a fifth partial region and a sixth partial region, the fifth partial region being provided between the third partial region and the third electrode in the first direction, the part of the fourth partial region being provided between at least a part of the sixth partial region and the second electrode in the second direction, a thickness of the sixth partial region in the second direction being less than a thickness of the fifth partial region in the first direction.

2. The element according to claim 1, wherein
the second partial region has a first side face and a second side face,
the first side face is provided between the fourth partial region and the second side face in the second direction, and
a position of the second side face in the second direction periodically changes along the first direction.

3. The element according to claim 1, wherein
the sixth partial region includes a first thickness region and a second thickness region,
a position of the first thickness region in the first direction is between a position of the second thickness region in the first direction and a position of the fifth partial region in the first direction,
a thickness of the first thickness region in the second direction being less than a thickness of the fifth partial region in the first direction, and
a thickness of the second thickness region in the second direction being less than the thickness of the first thickness region.

4. The element according to claim 1, wherein a length of the second partial region in the first direction is longer than a length of the first partial region in the second direction.

5. The element according to claim 4, wherein a length of the fourth partial region in the first direction is longer than a length of the third partial region in the second direction.

6. The element according to claim 1, wherein
the first magnetic layer further includes a seventh partial region,
a position of the second partial region in the first direction is between a position of the first partial region in the first direction and a position of the seventh partial region in the first direction,
a direction from a part of the seventh partial region toward the fourth partial region is along the first direction, and
the second partial region is connected with the first electrode via the seventh partial region.

7. The element according to claim 6, wherein a length of the second partial region in the first direction is longer than a length of the seventh partial region in the second direction.

8. The element according to claim 7, wherein
the first insulating layer further includes an eighth partial region,
a position of the fourth partial region in the first direction is between a position of the third partial region in the first direction and a position of the eighth partial region in the first direction, and
a part of the eighth partial region is provided between the seventh partial region and the fourth partial region.

9. The element according to claim 8, wherein a length of the fourth partial region in the first direction is longer than a length of the eighth partial region in the second direction.

10. The element according to claim 1, further comprising:
a first current source electrically connected with the first electrode and the second electrode; and
a second current source electrically connected with the second electrode and the third electrode.

11. A magnetic memory element, comprising:
a first electrode;
a second electrode;
a third electrode;
a first magnetic layer including a first partial region and a second partial region, the first partial region being provided between the second electrode and the third electrode in a first direction, the second partial region being electrically connected with the first electrode;
a first insulating layer including a third partial region and a fourth partial region, the third partial region being provided between the first partial region and the third electrode in the first direction, a part of the second partial region being provided between a part of the fourth partial region and the second electrode in a second direction crossing the first direction;
a second magnetic layer including a fifth partial region between the third partial region and the third electrode in the first direction; and
a second insulating layer contacting the fourth partial region, the fourth partial region being provided between the second insulating layer and the second partial region in the second direction.

12. The element according to claim 1, wherein
the second partial region has a first side face and a second side face,
the first side face is provided between the fourth partial region and the second side face in the second direction, and
a position of the second side face in the second direction periodically changes along the first direction.

13. The element according to claim 11, wherein a length of the second partial region in the first direction is longer than a length of the first partial region in the second direction.

14. The element according to claim 13, wherein a length of the fourth partial region in the first direction is longer than a length of the third partial region in the second direction.

15. The element according to claim 11, wherein
the first magnetic layer further includes a seventh partial region,
a position of the second partial region in the first direction is between a position of the first partial region in the first direction and a position of the seventh partial region in the first direction,
a direction from a part of the seventh partial region toward the fourth partial region is along the first direction, and
the second partial region is connected with the first electrode via the seventh partial region.

16. The element according to claim 15, wherein a length of the second partial region in the first direction is longer than a length of the seventh partial region in the second direction.

17. The element according to claim 16, wherein
the first insulating layer further includes an eighth partial region,
a position of the fourth partial region in the first direction is between a position of the third partial region in the first direction and a position of the eighth partial region in the first direction, and
a part of the eighth partial region is provided between the seventh partial region and the fourth partial region.

18. The element according to claim 17, wherein a length of the fourth partial region in the first direction is longer than a length of the eighth partial region in the second direction.

19. The element according to claim 11, further comprising:
a first current source electrically connected with the first electrode and the second electrode; and
a second current source electrically connected with the second electrode and the third electrode.

* * * * *